US012027230B2

(12) United States Patent
Bedeschi et al.

(10) Patent No.: US 12,027,230 B2
(45) Date of Patent: Jul. 2, 2024

(54) METHODS AND SYSTEMS FOR IMPROVING READ AND WRITE OF MEMORY CELLS

(71) Applicant: Micron Technology, Inc., Boise, ID (US)

(72) Inventors: Ferdinando Bedeschi, Biassono (IT); Riccardo Muzzetto, Arcore (IT); Umberto di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 17/498,919

(22) Filed: Oct. 12, 2021

(65) Prior Publication Data

US 2022/0068335 A1    Mar. 3, 2022

Related U.S. Application Data

(63) Continuation of application No. PCT/IB2020/020050, filed on Aug. 31, 2020.

(51) Int. Cl.
| | |
|---|---|
| *G11C 7/00* | (2006.01) |
| *G11C 7/10* | (2006.01) |
| *G11C 7/22* | (2006.01) |
| *G11C 8/18* | (2006.01) |
| *G11C 16/34* | (2006.01) |

(52) U.S. Cl.
CPC ........... *G11C 7/222* (2013.01); *G11C 7/1039* (2013.01); *G11C 7/1069* (2013.01); *G11C 7/1096* (2013.01); *G11C 8/18* (2013.01); *G11C 16/3404* (2013.01)

(58) Field of Classification Search
CPC ...................................................... G11C 7/062
USPC .................................................... 365/189.07
See application file for complete search history.

(56) References Cited

U.S. PATENT DOCUMENTS

| | | | |
|---|---|---|---|
| 9,275,722 | B2 | 3/2016 | Ji et al. |
| 9,947,401 | B1 | 4/2018 | Navon et al. |
| 2001/0007537 | A1 | 7/2001 | Agawa et al. |
| 2006/0181915 | A1 | 8/2006 | Oh et al. |
| 2008/0062741 | A1* | 3/2008 | Choi .................. G11C 13/0004 365/201 |
| 2016/0350180 | A1* | 12/2016 | Halbert ............... G06F 11/1048 |
| 2019/0198099 | A1* | 6/2019 | Mirichigni .......... G11C 11/5678 |
| 2019/0237131 | A1* | 8/2019 | Ito ........................... G11C 7/24 |
| 2019/0303283 | A1* | 10/2019 | McGlaughlin ........ G06F 3/0616 |
| 2020/0185019 | A1 | 6/2020 | Vimercati |
| 2022/0083260 | A1* | 3/2022 | Lee ...................... G06F 3/0679 |

OTHER PUBLICATIONS

International Search Report and Written Opinion, PCT/IB2020/020050, dated May 25, 2021.

\* cited by examiner

*Primary Examiner* — Hoai V Ho
(74) *Attorney, Agent, or Firm* — Greenberg Traurig

(57) ABSTRACT

A method for accessing of memory cells where a set of user data is stored in a plurality of memory cells of the memory array, including: latching a current row address of a selected plurality of memory access; comparing a last row address with the current row address; if the result of the comparison is negative, executing a leakage compensation algorithm through a memory sensing circuitry; if the result of the comparison is positive, waiting for the completion of a write to read procedure on the selected plurality of memory cells.

16 Claims, 12 Drawing Sheets

METHODS AND SYSTEMS FOR IMPROVING READ AND WRITE OF MEMORY CELLS

CROSS-REFERENCE TO RELATED APPLICATION

The present application is a continuation application of International Patent Application No. PCT/IB2020/020050, filed on Aug. 31, 2020, and entitled "METHODS AND SYSTEMS FOR IMPROVING READ AND WRITE OF MEMORY CELLS," the entire disclosure of which application is hereby incorporated herein by reference.

TECHNICAL FIELD

The present disclosure relates generally to operating an array memory of memory cells, and more particularly to improved write-based methods and systems for accessing memory cells.

BACKGROUND

Memory devices are used in many electronic systems such as mobile phones, personal digital assistants, laptop computers, digital cameras and the like. Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Nonvolatile memories retain their contents when power is switched off, making them good choices in memory devices for storing information that is to be retrieved after a system power-cycle. In particular, non-volatile memory cells may maintain their stored logic state for extended periods of time even in the absence of an external power source. Volatile memory cells may lose their stored state over time unless they are periodically refreshed by an external power source.

Information is stored by programming different states of a memory device. For example, binary devices have two states, often denoted by a logic "1" or a logic "0." In other systems, more than two states may be stored. To access the stored information, a component of the memory device may read, or sense, the stored state. To store information, a component of the memory device may write, or program, the logic state.

Improving memory devices, generally, may include increasing memory cell density, increasing read/write speeds, increasing reliability, increasing data retention, reducing power consumption, reducing manufacturing costs, as well as scaling smaller than traditional devices (which may lead to relatively high rates of errors), and the like.

A more efficient write technique may be desired to increase memory devices performances and reliability when memory cells exhibit variable electrical characteristics, particularly memory devices having a three-dimensional (3D) array of memory cells.

DETAILED DESCRIPTION

With reference to those drawings, methods and systems for an improved accessing operation of memory cells will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines. Flash memories are well established and well suited for mass storage applications; however, their performances do not meet present day most demanding applications. New technologies, for example 3D Cross Point (3DXPoint) memories and Self-Selecting Memories (SSM) have better performances, for example in terms of access time and access granularity (data may be programmed and read with page, word or—in principle—even bit granularity). Writing data during a write operation is more and more challenging with scaled technologies since it requires a relatively high programming voltage and the present disclosure provides for methods and systems for improved write to read operations.

Figure 1:
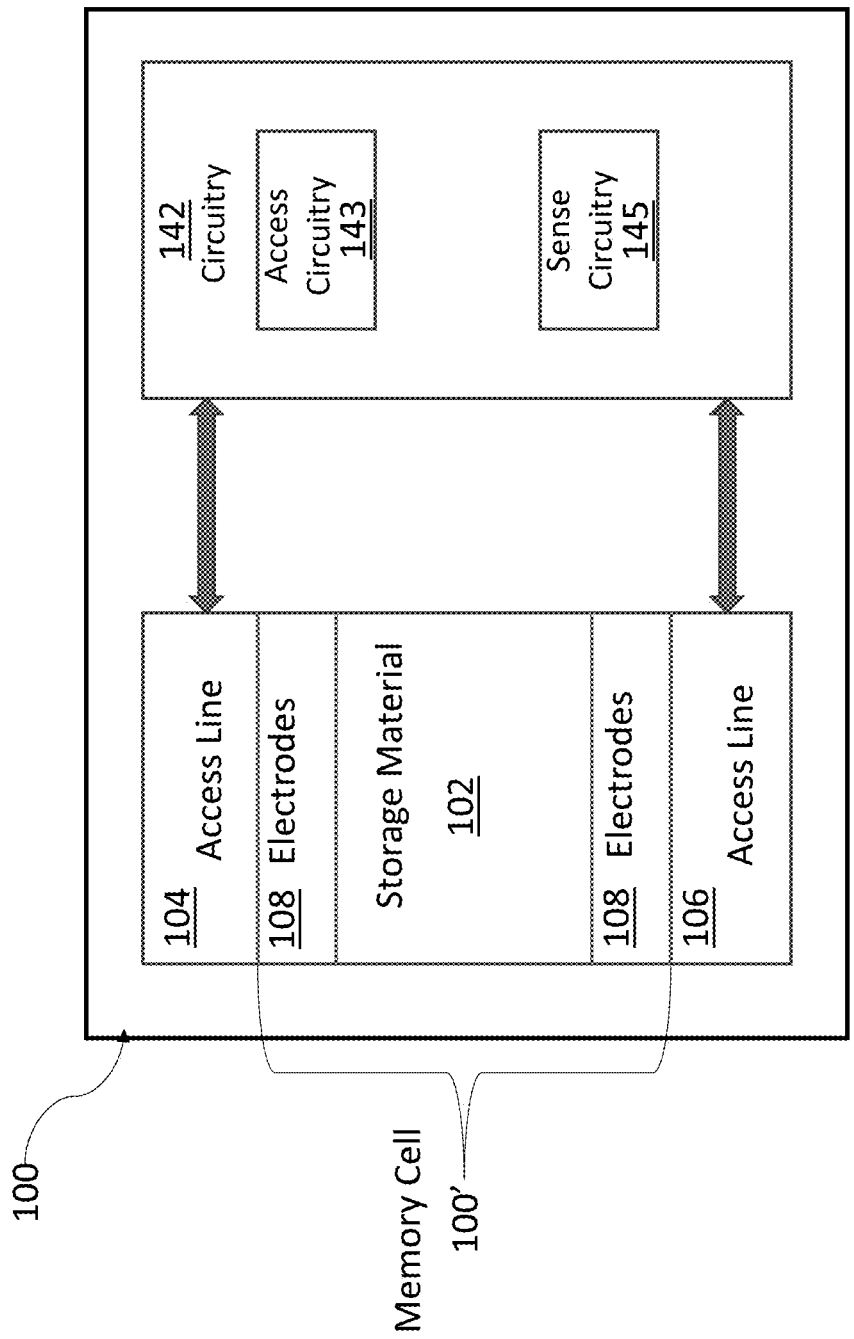
FIG. 1 is an exemplary block scheme illustrating an exemplary memory cell that can be read and written according to embodiments of the present disclosure.

FIG. 1 illustrates a block scheme of an exemplary assembly 100 comprising a memory cell 100' that can be arranged in an array and then programmed and read according to the present disclosure.

In the embodiment illustrated in FIG. 1, the memory cell 100' includes a storage material 102 between access lines 104 and 106. The access lines 104, 106 electrically couple the memory cell 100' with circuitry 142 that writes to and reads from the memory cell 100'. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to access circuitry 143. Access circuitry can store information in the memory cell 100' by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100' is a self-selecting memory cell that includes a single layer of material that acts as both a selector element to select the memory cell and a memory element to store a logic state, i.e. a state related to a given polarity of the cell.

In one embodiment, the storage material 102 is a phase change material. A phase change material can be electrically switched between a generally amorphous and a generally crystalline state across the entire spectrum between completely amorphous and completely crystalline states. The memory cell 100' may further include a selection device (not shown) between access lines 104 and 106; the selection device may be serially coupled to the storage material 102. In another embodiment, the storage material 102 is not a phase change material. In one embodiment in which the storage material 102 is not a phase change material, the storage material is capable of switching between two or more stable states without changing phase. The access circuitry 143 is able to program the memory cell 100' by applying a voltage with a particular polarity to cause the storage material 102 to be in the desired stable state.

In one such embodiment, programming the memory cell 100' causes the memory cell 100' to "threshold" or to undergo a "threshold event." When a memory cell thresholds (e.g., during a programming voltage pulse), the memory cell undergoes a physical change that causes the memory cell to exhibit a certain threshold voltage in response to the application of a subsequent voltage (e.g., a read voltage with a particular magnitude and polarity). Programming the memory cell 100' can therefore involve applying a voltage of a given polarity to induce a programming threshold event, which causes the memory cell 100' to exhibit a particular threshold voltage at a subsequent reading voltage of a same or different polarity. In one such embodiment, the storage material 102 is a self-selecting material (e.g., a non-phase change chalcogenide material or other self-selecting material) that can be programmed by inducing a threshold event.

As it is explained in further detail below, the output of such a memory cell when read differs as a function of the polarity used to program the memory cell and the polarity used to read the memory cell. For example, the storage material 102 can exhibit a "lower threshold voltage" or a "higher threshold voltage" in response to a read voltage based on the polarity of both the programming and read voltages. In the context of the present disclosure, exhibiting a threshold voltage means that there is a voltage across the memory cell that is approximately equal to the threshold voltage in response to the application of a voltage with a particular magnitude and polarity to the terminals of the memory cell. The threshold voltage thus corresponds to the minimum voltage that is needed to be applied at the input(s) to produce output(s), i.e. to see a determined electrical response of the cell. In other words, in the context of the present disclosure, the verb "threshold" means that the cells undergo a threshold event, i.e. they have an electrical response in response to the applied voltage that is above a given threshold, thus exhibiting a peculiar threshold voltage.

As mentioned above, the access lines 104, 106 electrically couple the memory cell 100' with circuitry 142. The access lines 104, 106 can be referred to as a bitlines and wordlines, respectively. The wordline is for accessing a particular word in a memory array and the bitline is for accessing a particular bit in the word. In one embodiment, the access lines 104, 106 can be made of one or more suitable metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be made of one or more conductive and/or semiconductive materials such as, for example: carbon (C), carbon nitride (CxNy); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including RuO2, or other suitable conductive materials.

The stack made of electrodes 108 and storage material 102 is hereinafter referred to as the memory cell 100', without limiting the scope of the disclosure. In various embodiments, the memory cell 100' may comprise more or less elements. Therefore, the memory cell 100' is one example of a memory cell. Other embodiments can include memory cells having additional, less, or different layers of material than the ones illustrated in FIG. 1 (e.g., a thin dielectric material between the storage material and access lines and the like).

Referring again to the circuitry 142, the access lines 104, 106 communicatively couple the circuitry 142 to the memory cell 100', in accordance with an embodiment. The circuitry 142 includes access circuitry 143 and sense circuitry 145. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100'. The terms "write" and "program" are used interchangeably to describe the act of storing information in a memory cell. To write to the memory cell 100', the access circuitry applies a voltage pulse with a particular magnitude and polarity to the access lines 104, 106, which can both select memory cell 100' and program memory cell 100'.

For example, the access circuitry 143 applies a read voltage with one polarity to program the memory cell 100' to be in one logic state and applies a pulse with a different polarity to program the memory cell 100' to be in a different logic state. The access circuitry 143 can then differentiate between different logic states as a consequence of the programming polarity of a memory cell. For example, in a case of a memory read, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100' based on electrical responses to one or more of the voltage pulses in a read sequence.

The electric current generated upon application of a reading voltage thus depends on the threshold voltage of the memory cell determined by the electrical resistance of the logic state storage element. For example, a first logic state (e.g., SET state) may correspond to a finite amount of current, whereas a second logic state (e.g., RESET state) may correspond to no current or a negligibly small current. Alternatively, a first logic state may correspond to a current higher than a current threshold, whereas a second logic state may correspond to a current lower than the current threshold.

Figure 2:
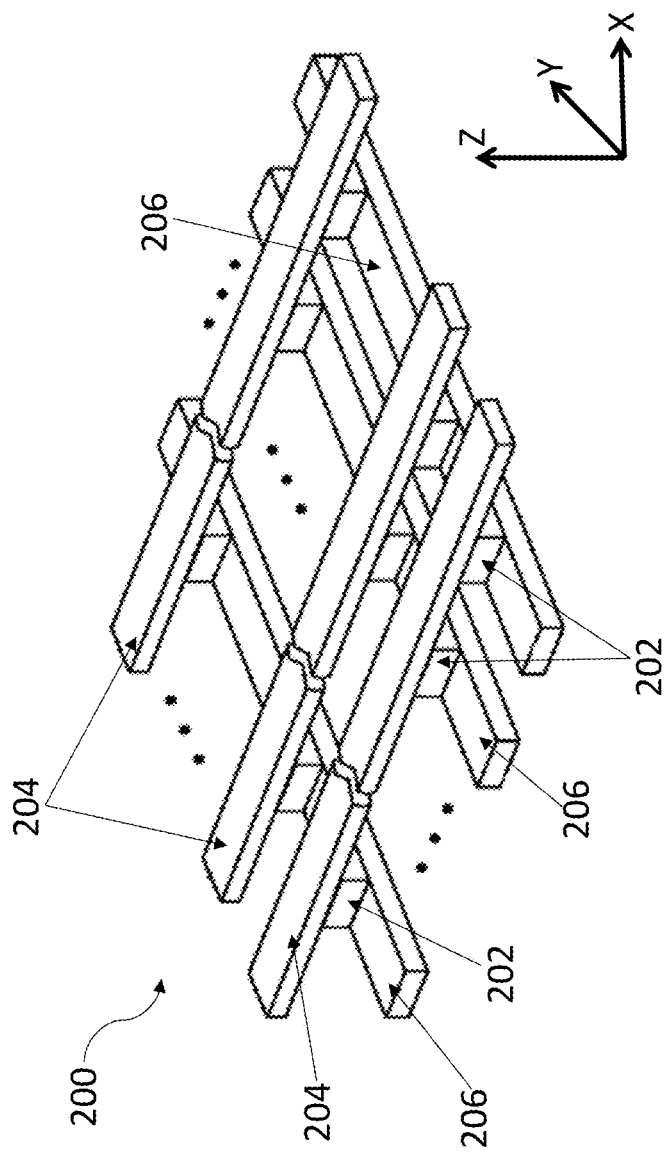
FIG. 2 schematically illustrates a portion of an exemplary memory cell array.

FIG. 2 shows a portion of a memory cell array 200, which can include a plurality of memory cells such as the memory cell 100' of FIG. 1, in accordance with an embodiment. The memory cell array 200 is an example of a three-dimensional cross-point memory structure (3D X Point). The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. As disclosed in relation to FIG. 1, storage material 202 may be a self-selecting storage material, in some examples; storage material 202 may be serially coupled to a selection device (not shown), in other examples. In one embodiment, a "cross-point" is formed at an intersection between a bitline and a wordline. A memory cell is created from the storage material 202 between the bitline and wordline where the bitline and wordline intersect (it is noted that, in FIG. 2, additional layers such as electrodes are not shown, so that the cell is schematically represented in said figure by the storage material 202 only, without limiting the scope of the disclosure, and additional layers may be present). Generally speaking, the intersection defines the address of the memory cell. The storage material 202 can be a chalcogenide material such as the storage material 102 described above with respect to FIG. 1. In one embodiment, the access lines 204, 206 are made of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction).

A "cross-point" thus refers to a place where a memory cell is formed such that access lines associated with the memory cell topologically "cross" each other as access lines connect to different nodes of the memory cell. Cross-point architecture enables reaching the theoretical minimum cell area determined by the minimum pitch of access lines.

FIGS. 1 and 2 illustrate an example of a memory cell and array. However, other memory cell structures and arrays may be used, in which the memory cells exhibit electrical responses that vary as a function of programming and read polarity. A memory cell (not shown) may be formed at crossing locations between vertical conductive pillars, acting as bitlines, intersecting horizontal conductive planes, acting as wordlines, in a 3D memory array, for example. This and other array organizations may also lead to a cross-point architecture as described above.

Ideally, all memory cells of a memory device should feature a same (nominal) resistivity and therefore a same threshold voltage for a same logic state, wherein the threshold voltage is the voltage to be applied to the memory cells for causing them to conduct an electric current, i.e. the minimum value of the voltage that is needed to create a conducting path between the terminals, as above defined. However, since different cells programmed to a same logic state practically exhibit different resistivity values because of several factors (such as for example variations in the electrical characteristics of the phase-change material caused by the execution of a number of read-write operations and/or by manufacturing tolerances), each logic state is actually associated to a respective resistivity distribution (typically a Gaussian-type distribution), and therefore to a respective threshold voltage distribution.

In order to assess the logic state of a cell, a reading operation is carried out to assess to which threshold voltage distribution the threshold voltage of the cell belongs. For example, a reading voltage may be applied to the cell via access lines and the logic state of the cell is assessed based on (the presence or absence of) a current responsive to said reading voltage, the (presence or absence of the) current depending on the threshold voltage of the cell. A cell thresholds (e.g., it becomes conductive) when a suitable voltage difference is applied between its two terminals; such a voltage difference may be obtained in different ways, for example biasing one terminal, such as a wordline terminal, to a negative voltage (e.g. a selection voltage), and the other terminal, such as a bitline terminal, to a positive voltage (e.g. a reading voltage). Other biasing configurations may produce the same effects (e.g., both the word line and the bitline terminal biased to positive voltage, or the wordline terminal biased to a reference voltage, e.g. a ground voltage, and the bitline terminal biased to a positive voltage).

In other words, operations such as programming and reading, which may be referred to as access operations, may be performed on memory cells by activating or selecting a wordline 206 and bitline 204. As known in the field, wordlines 206 may also be known as row lines, sense lines, and access lines. Bitlines 204 may also be known as digitlines, column lines, data lines, as well as access lines. References to wordlines and bitlines, or their analogues, are interchangeable without loss of understanding or operation. For example, the access lines may be wordlines and the data lines may be bitlines. Wordlines 206 and bitlines 204 may be perpendicular (or nearly perpendicular) to one another to create an array, as previously shown with reference to FIG. 2. Depending on the type of memory cell (e.g., FeRAM, RRAM, etc.), other access lines (not shown in the figures) may be present, such as plate lines, for example. It should be appreciated that the exact operation of the memory device may be altered based on the type of memory cell and/or the specific access lines used in the memory device. Activating or selecting a wordline 206 or a bitline 204 may include applying a voltage to the respective line via a dedicated driver. By activating one wordline and one bitline, a single memory cell 202 may be accessed at their intersection. Accessing the memory cell may include reading or writing the memory cell.

Accessing memory cells may be controlled through a row decoder and a column decoder (not shown). For example, a row decoder may receive a row address from a memory controller and activate the appropriate wordline based on the received row address. Similarly, a column decoder may receive a column address from the memory controller and activate the appropriate bitline.

As mentioned before, in some cases, memory cells 202 may exhibit different electrical characteristics after a number of cycling operations (e.g., a series of read or write operations). For example, a threshold voltage of a memory cell 202 (e.g., PCM cell) corresponding to a logic state of 1, after receiving an identical programming pulse to store the logic state of 1 (e.g., a SET programming pulse), may be different if a memory cell is relatively new (e.g., a PCM cell with a small number of read or write operations) compared to a memory cell having been cycled through an extensive number of read or write operations. In addition, in some cases, a chalcogenide material in the memory cells (e.g., the logic storage element 102 or 202) may experience a change (which may also be referred to as a drift) in its resistance after programming (e.g., crystallizing or quenching) of the chalcogenide material during a write operation. Such change in resistance may result in changes in threshold voltages of memory cells and may hinder accurately reading information from memory cells (e.g., PCM cells) after a certain period of time elapsed. In some embodiments, the amount of change may be a function of ambient temperature. In many cases, it may be impractical to rely only on error correction mechanisms to handle the errors.

The present disclosure provides a more efficient write or programming technique also when memory cells (e.g., PCM cells or SSM cells) exhibit different, non-uniform, variable electrical characteristics that may originate from various factors including statistical process variations, cycling events (e.g., read or write operations on the memory cells), or a drift (e.g., a change in resistance of a chalcogenide alloy), among others. The voltage distributions of the cells may thus drift in time or exhibit shapes deviating from perfect statistical functions, e.g. deviating from a perfect gaussian curve.

More particularly, according to the write technique of the present disclosure, an auto-referenced reading of a set of user data (e.g., a codeword, a page) is performed based on data information previously stored in a codeword, said data information accounting for the statistical properties of the voltage distribution of the cells of the codeword, providing a new and more efficient solution for reading memory cells, in particular in 3D memory devices.

According to the present disclosure, the memory cells may be configured to store encoded user data that include modified user data (or original user data, in some cases) and a number of bits (e.g., flip-bits), which may be added thereto. In some cases, the encoded user data stored in the memory cells have been modified to include a certain number of bits having the logic state of 1. The number of bits having the logic state of 1 may vary within a predetermined range. As it will be disclosed in the following, the auto-referenced read of the present disclosure determines a proper read reference voltage to be applied to the memory cells, namely a voltage that is to be used to discern whether a memory cell exhibits a logic state of 1 (e.g., a SET status) or a logic state of 0 (e.g., a RESET status). The auto-referenced read may determine the read reference voltage for the memory cells by taking into account the statistical distributions of the bits programmed in the memory cells, e.g. of the bits of a codeword CW.

Figure 3:
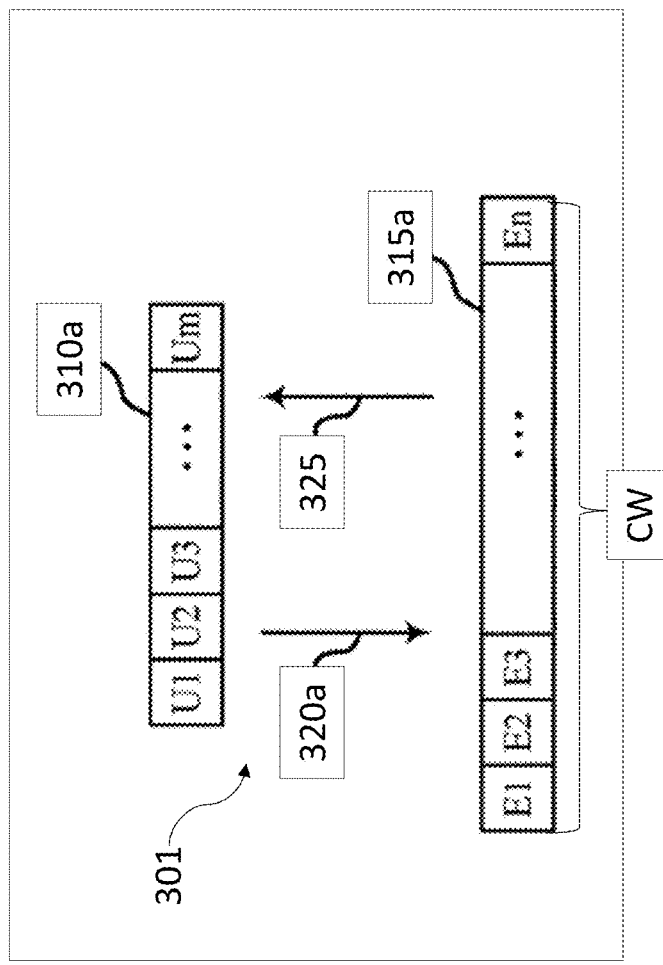
FIG. 3 illustrates an example of data pattern supporting a reading operation according to an embodiment of the present disclosure.

FIG. 3 illustrates an exemplary user data pattern diagram 301. The user data pattern diagram 301 includes user data 310a and encoded user data 315a. Encoding process 320a, which is performed in the programming phase of the array of memory cells, may convert the user data U1, U2, . . . , Um into the encoded user data 315a. The encoded user data 315a may be stored in a set of memory cells, which may be, for example, memory cells 100' or 202 described with reference to FIGS. 1 and 2. Each box C1, C2, . . . , Cn of the encoded user data 315a may correspond to a memory cell that may exhibit a logic state of 1 or a logic state of 0. During the encoding process 320a, a number of parity bits may be added to the user data 310a to establish a predetermined number of bits of the encoded user data 315a having a given logic value (e.g., a logic value of 1). As a result, a number of bits in the encoded user data 315a may be greater than the number of bits in the user data 310a (e.g., n is larger than m if some bits, e.g. parity bits, are added). Process 325 may convert the encoded user data 315a back to the user data 310a after the encoded user data 315a have been accurately read.

In an embodiment, the plurality of encoded bits to be read represents a codeword (CW). The codeword may be programmed to include various information, e.g., additional special information, to be used during the reading phase, but the codeword where the new value must be programmed may be already stored in the memory cells, and therefore the cells would include a series of "1" and "0" logic values.

A proper codeword (CW) analysis comparing the logic values already stored in the codeword with the number of "1's" or 0's to be later used during the write algorithm may be performed. This analysis is performed after the storing in volatile (or non-volatile) counters just the number of "1" or "0" of the codeword. This allows reducing the number of cells to be programmed. If the logic value "1" is required to be programmed in a memory cell wherein the logic value "1" is already stored in this memory cell, there is no need to do anything and the programming phase of that cell may be omitted. This action is called masking. A register may be provided, and all programmed or masked bits may be stored in the register.

Therefore, the programming pulse is shifted on those bits that are already stored with the same logic value of the bit of the new codeword. Even during the programming phase of the remaining bits, i.e. the bits that must be modified in their logic values, the raising programming pulse may be stopped once a bit is changed in its logic value thus avoiding stressing the bit with higher voltage value. To implement this procedure, at least a register including the codeword that must be programmed and a register including the already programmed codeword may be provided. From both these two registers, a new register including the masks may be extracted, i.e. the bits that must be left as they are. A third register may be not even necessary since the codeword to be written could be stored in the registers of the sense amplifier. In any case, a third register would be a temporary register. A comparison between the codeword to be written and the codeword already stored may generate an "on-line" masking register used immediately to implement the writing phase.

In some embodiments, for each set of user data 310a, corresponding encoded user data 315a may have a same number of memory cells exhibiting a logic state of 1 and a logic state of 0 (which may also be referred to as a balanced encoding scheme, where half of the encoded user data bits have a logic state of 1, and the other half have a logic state of 0). As such, the encoded user data may be referred to have a 50% weight. In some embodiments, for each user data 310a, corresponding encoded user data 315a may have a predetermined number of memory cells exhibiting a given logic state (e.g., a logic state of 1), hence producing a constant weight that may be different than 50% (which may also be referred to as a constant weight encoding scheme). In general, an outcome of the encoding process 320a may be that a predetermined number of memory cells exhibiting a given logic state (e.g., a logic state of 1) in the encoded user data 315a is established.

In other words, according to an embodiment of the present disclosure, the codeword may be manipulated to constrain the number of bits exhibiting a given logic state (e.g. a logic state of 1) to a known desired predetermined value, generally between a minimum value and a maximum value (e.g., between {Min1, Max1}, or within a range), by adding some extra bits of information; the extra bits of information may sometime be referred to as special information. Therefore, in some embodiments, the memory cells of the array may be configured to store encoded user data that include modified user data (or original user data, in some cases) and a number of bits which may be added thereto, i.e. a data manipulation is performed to constrain the number of bits having a given logic state (e.g. the number of bits having the logic value 1) in a codeword by few (e.g. 2-4) parity or inversion bits. In this way, the statistics of the codeword is improved by using distributions having a reasonable number of bits in a given logic state, in particular having a predetermined number of bits having a logic state 1, or having a number of bits having a logic state of 1 in a given range, facilitating the reading operation and avoiding extreme cases with very few bits exhibiting the logic state 1. This also allows to statistically track usage (e.g. drift and cycling) of the codeword with few extra bits, as well as improving speed.

In some cases, the encoding scheme may result in the total number of bits in the encoded user data having a given logic state (e.g., a logic value of 1) being in a predetermined weight range (e.g., 48%-50%, 40%-48%, 40%-45%, or 20%-25%, for example) rather than an exact predetermined weight. Some additional bits may be programmed to obtain an exact weight, in some cases.

In the context of the present disclosure, a bit having the logic state of 1 (e.g. corresponding to a cell in the logic state 1) is identified as a bit in a first logic state, whereas a bit having the logic state of 0 (e.g. corresponding to a cell in the logic state 0) is identified as a bit in a second logic state, even if other definitions may be used. According to an embodiment of the present disclosure, the memory cells exhibit a threshold voltage with a lower magnitude when the memory cells are in the first logic state, and a threshold voltage with a higher magnitude when the memory cells are in the second logic state, the logic state of a given cell being determined based on whether the memory cell exhibits a higher or lower magnitude threshold voltage in response to an applied read voltage.

Summing up, the present disclosure thus provides, in the programming phase, the storage of user data (such as the encoded user data 315a) in a plurality of memory cells of the memory array, these data being subjected to encoding schemes as previously described. More in particular, when storing the user data, they may be encoded in a codeword having a predetermined number of bits exhibiting the first logic value. For example, in an embodiment, the encoded user data may have a same number of bits having the logic value of 1 and the logic value of 0, i.e. the encoded user data have substantially a same number of bits exhibiting the first logic state and the second logic state, even if other configurations in which the encoded user data have a known predetermined number of bits in the first logic value may be used. The present disclosure may thus include an encoding technique that ensures a certain number bits in the set of user data (e.g., a codeword of 128 bits) to have a given logic state (e.g., a logic state of 1) prior to storing the user data in memory cells (e.g., PCM cells, 3DXPoint memory cells). In some embodiments, a logic state of 1 (e.g., a SET state of cell, which may also be referred to as a SET cell or bit) corresponds to a set of threshold voltages lower than a set of threshold voltages associated with a logic state of 0 (e.g., a RESET state of a cell, which may also be referred to as a RESET cell or bit). The encoding technique may provide a number of bits having the logic state of 1 (e.g., the SET bits) within a certain range which may be established by a predetermined factor k. The ratio between a number of bits having the logic state of 1 (e.g., 32 SET bits) and a total number of bits in the user data (e.g., 128 bits) may be referred to as a weight (e.g., 25% weight) or a weight pattern. In some examples, the encoding technique may ensure the encoded user data to have a particular weight within a range of weights (e.g., between 50% and (50+50/k) %) established by the predetermined factor k. The larger the value of k, the narrower the range may become, which may result in an increased accuracy of the read operation. Further, the encoding technique may track changes in the user data during the encoding operation by storing k number of bits associated with the encoded user data. The k number of bits, which may also be referred to as flip-bits, may indicate a status of the original user data such that decoding of the encoded user data may be carried out accurately. In other words, the codeword may be encoded as wanted (e.g., to the desired number of bits having the logic state of 1) for improving read reliability or performance.

Figure 4:
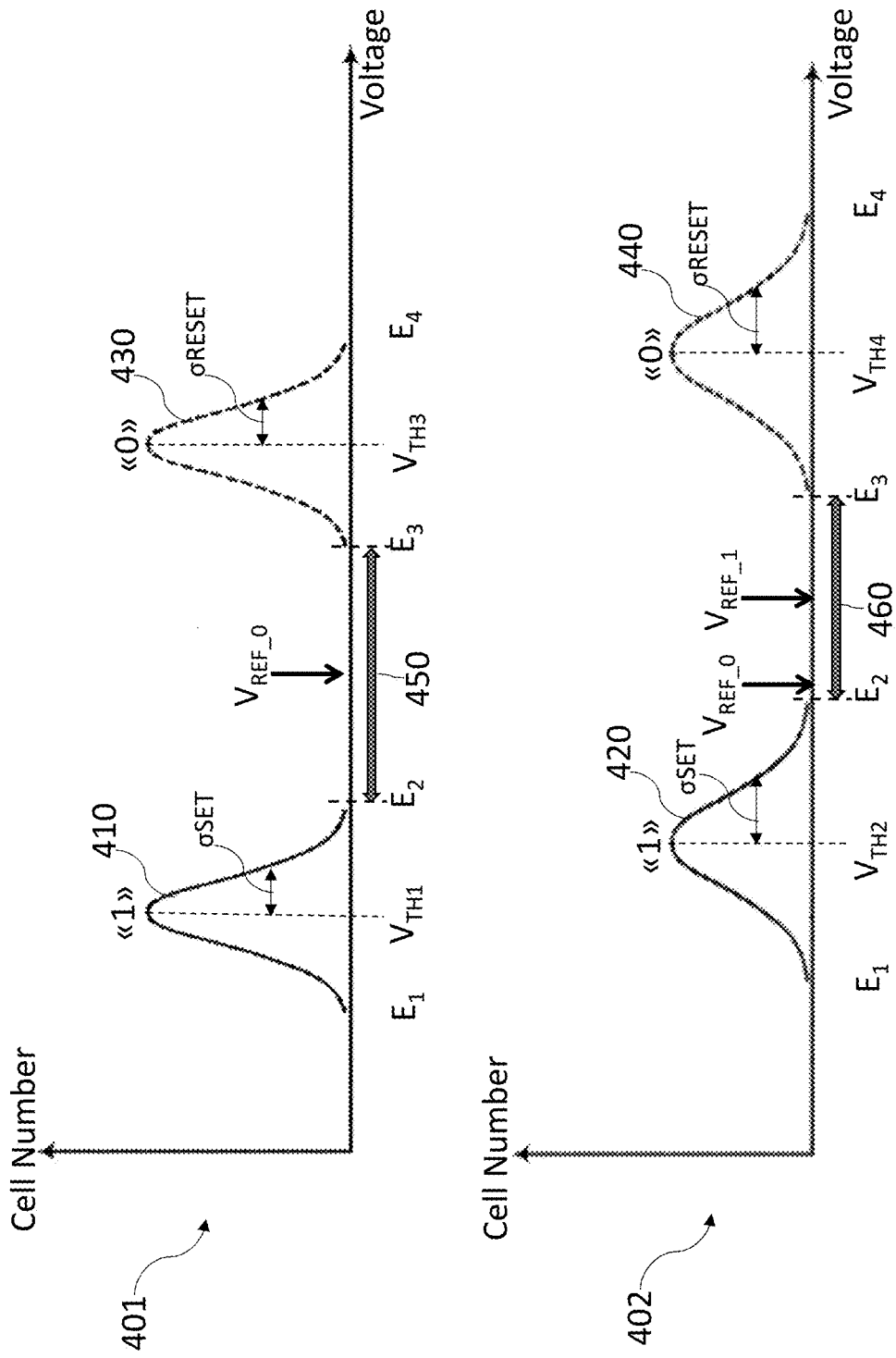
FIG. 4 schematically illustrates examples of threshold voltage distributions that support the reading operation according to embodiments of the present disclosure.

FIG. 4 illustrates examples of threshold voltage ($V_{TH}$) distribution diagrams 401 and 402 of memory cells that supports write techniques in accordance with embodiments of the present disclosure. Each diagram 401 or 402 represents two groups of threshold voltages corresponding to two logic states (e.g., a logic state of 1, a logic state of 0) of the memory cells. The memory cells (e.g., PCM cells) may be embodiments of the memory cells 100' or 202 described with reference to FIGS. 1 and 2. The logic state of 1 may correspond to a first set of threshold voltages (e.g., a distribution 410, a distribution 420) of the memory cells. The average threshold voltage for the logic value "1" is between E1 and E2, e.g., ½(E1+E2) in the average. In some cases, the logic state of 1 is referred to as a SET state of a memory cell. The logic state of 0 may correspond to a second set of threshold voltages (e.g., a distribution 430, a distribution 440) of the memory cells. The average threshold voltage for the logic value "0" is between E3 and E4, e.g., ½(E3+E4) in the average. In some cases, the logic state of 0 is referred to as a RESET state of a cell.

Distribution diagram 401 depicts a number of memory cells (y-axis) as a function of threshold voltages $V_{TH}$(x-axis) of the memory cells. The memory cells of the distribution diagram 401 may represent a set of memory cells storing encoded user data in accordance with the encoding scheme of the present disclosure, as mentioned above. In other words, the encoded user data has a number of bits having the logic state of 1 (e.g., SET cells) within a predetermined range previously mentioned. The distribution 410 illustrates a threshold voltage $V_{TH}$ distribution of memory cells programmed to the logic state of 1. The distribution 430 illustrates a threshold voltage $V_{TH}$ distribution of memory cells having the logic state of 0. The distribution 410 may have a median value (or peak value) denoted as $V_{TH1}$. A standard deviation (e.g., σSET) of the distribution 410 determines the width of said distribution 410. Similarly, the distribution 430 may have a median value denoted as $V_{TH3}$ and a standard deviation (e.g., σRESET) that determines the width of said distribution 430. The distributions may be gaussian distributions or other statistical functions depending on various factors.

It should be further kept in mind that in the negative threshold voltage $V_{TH}$ distribution of the memory cells (not shown) the situation of is reversed if referred to the origin of the axis and the distribution of memory cells programmed to the logic state of "1" has the higher threshold voltages considered in absolute value while the distribution of memory cells programmed to the logic state of "0" has the lowest threshold voltages, always considered in absolute value.

In some embodiments, each distribution may not be symmetrical around its median threshold voltage $V_{TH}$, as shown below. In some embodiments, each distribution may exhibit a different ranges of threshold voltage $V_{TH}$ values (not shown).

A difference between the highest threshold voltage of the memory cells having the logic state of 1 and the lowest threshold voltage of the memory cells having the logic state of 0 is referred to as a read window budget 450. A desired read reference voltage may be determined to be at or near the middle of the read window budget 450 and is denoted by $V_{REF\_0}$ in FIG. 4. The threshold voltage $V_{TH}$ distributions diagram 401 may illustrate voltage distributions of a set of memory cells that are relatively new (e.g., PCM cells with a small number of cycling operations) or recently programmed (e.g., memory cells without a significant drift).

Similarly, threshold voltage $V_{TH}$ distributions diagram 402 depicts a number of memory cells (y-axis) as a function of threshold voltages (x-axis) of the memory cells. The distributions diagram 402 may illustrate distributions of the encoded user data (e.g., the encoded user data represented by the distribution diagram 401) stored in a set of memory cells that may have experienced an extensive number of cycling operations representing a different electrical characteristic. The distribution 420 illustrates a threshold voltage $V_{TH}$ distribution of memory cells having the logic state of 1. The distribution 440 illustrates a threshold voltage $V_{TH}$ distribution of memory cells having the logic state of 0. The distribution 420 may have a median value denoted as $V_{TH2}$ that may be greater than $V_{TH1}$. The distribution 440 may have a median value denoted as $V_{TH4}$ that may be greater than $V_{TH3}$, i.e. peak value may drift. A σSET of the distribution 420 may be greater than the σSET of the distribution 410. A σRESET of the distribution 440 may be greater than the σRESET of the distribution 430, i.e. distributions may be larger. As a result, a read window budget 460 of the threshold voltage distributions diagram 402 may be different (e.g., less) than the read window budget 450 of the threshold voltage distributions diagram 401. Therefore, the read reference voltage $V_{REF\_0}$ for the distributions diagram 401 may not be appropriate for the distributions diagram 402. A new desired read reference voltage $V_{REF\_1}$ may be configured to support accurate reading of the memory cells of the distributions diagram 402. The change in the read window budget and the associated change in the read reference voltage, as well as the change in the shape of distributions, may be a result of memory cells experiencing extensive cycling operations and/or significant drift events, and the present disclosure provides methods and systems to perform an efficient reading operation of these cells.

The use of fixed, defined a priori, reference read voltages $V_{REF}$ (also known in this field as VDM) may result in read inaccuracy, for instance when the value of a reference voltage used for reading cells in the first logic state 1 is close to the minimum threshold voltage of the cells in the second logic state 0, so that reading may be negatively affected.

The reading of the codeword may be improved according to the present disclosure by reducing the growth of threshold voltage E4 and any unnecessary window budget requirement. This will trigger positive feedback to improve the Bit Error Rate (BER), cycling and power.

Moreover, it's known that drift, Write to Read delay (W2R), cycling and Reset Read Disturb are window budget detractors of the memory capability in this technology thus pushing out the reference read voltages $V_{REF}$ and pushing up the E4 voltage. The voltage E4 may be considered the highest voltage for switching the memory cell either in the positive or in the negative domain.

Managing all the above-mentioned degrading factors will reduce the raising of the reference read voltages $V_{REF}$ and of threshold voltage E4.

As positive consequence of a possible reference read voltages $V_{REF}$ reduction will be a better cycling, less leakage, less Inhibit disturb and of course less power. Moreover, reducing required margin by lowering the reference read voltages $V_{REF}$ would improve the Bit Error Rate (BER).

In one example, the memory device may include an amplifier component coupled with or between a memory cell and a latch. The amplifier component may be, in some cases, a differential amplifier. In this example, the access line may be precharged to a first voltage by coupling the access line with an amplifier component.

In another example, the amplifier component may be, in some cases, a folded cascode amplifier. In this example, the access line may be set to an initial voltage that may be greater than a first voltage. The access line may be precharged to the first voltage by coupling the access line with an amplifier component (e.g., the access line may discharge through the amplifier component). Then, similar to the differential amplifier operation, charge may be transferred between the access line and the memory cell. The access line may transition from the first voltage to a second voltage. Another charge transfer operation, which may happen subsequent to or contemporaneously with the first charge transfer operation, may transfer charge between the access line and a capacitor. The access line may transition from the second voltage to a third voltage based on this second charge transfer operation. Last, a state of the memory cell may be determined based on amplifying the third voltage using the amplifier component.

Figure 5:
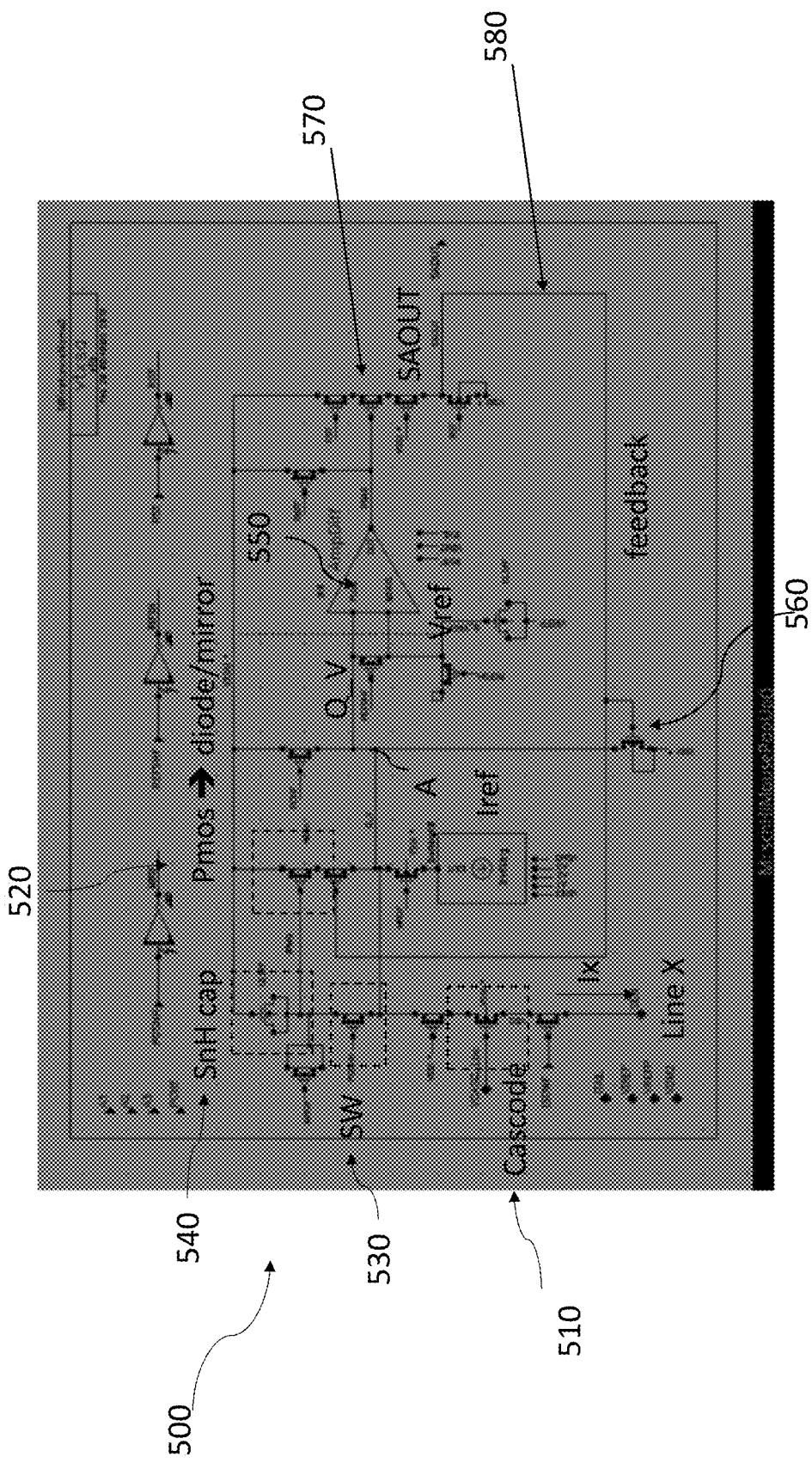
FIG. 5 is a schematic view of the structure of a sense amplifier circuit supporting reading operations according to an embodiment of the present disclosure.

According to the present disclosure techniques are provided for sensing the stored state of a memory cell based on precharging an access line of the memory cell using a same device that determines the stored state (e.g., precharging using a sense amplifier). Sensing a memory cell capable of storing one or more states may be improved by implementing a sense amplifier precharging an access line to increase the reliability of the sensing operation. The access line may then charge share with the memory cell, which may result in high-level states and low-level states on the access line. By precharging the access line with the sense amplifier and implementing charge sharing between the access line and a capacitor, which may be a reference capacitor, the high-level state and the low-level state on the access line may shift so that the two levels may be approximately centered around the precharge value on the access line FIG. 5 shows a schematic view of the structure of a sense amplifier circuit 500 supporting precharging and reading operations according to embodiments of the present disclosure.

The sense amplifier 500 includes a cascode circuit portion 510, for instance a source follower, coupled to a digit line X that can be pre-charged to a voltage value corresponding to the cascade biasing voltage Vcasc minus a threshold value Vth. Just as an example, if the threshold voltage is set to ½ Volt, and the digit line must be pre-charged to 1.5 Volt, the voltage applied to the cascode circuit portion 510 would be of 2 Volt. This voltage value applied to the cascode circuit portion 510 is automatically obtained by a circuit device located at the periphery of the sense amplifier and configured to select the right biasing voltage for the circuit portion 510 according to the voltage value desired on the digit line.

Obviously, the pre-change phase requires a limited time, for instance between 10 to 20 ns, to allow the digit line X to reach the desired voltage value.

The initial current value required for the pre-charge phase is drawn by a MOS element 520 configured as a diode and having a low output resistance value Rout to measure the current at the end of the pre-charge phase. The MOS element may be a PMOS transistor.

A switch SW 530 is initially open to conduct the current to the digit line X. Once the voltage value on the digit line X has reached the desired value, the switch is closed and the sole current flowing is a leakage current. One of the scopes of the sense amplifier is also that of compensating the leakage current to avoid false reading.

A current generator Iref is provided in parallel and in a mirror configuration with respect to the digit line X.

The closure of the switch 530 allows measuring the leakage current value at the end of the precharge phase. We should consider that all the memory cells coupled to the same digit line but not selected by a same word line have a word line voltage value close to zero but are biased by a voltage value on the digit line. In this situation each cell will start draining a small leakage current that, however, summed with all the other small leakage currents produces a detectable value Ileakage.

When the switch 530 is re-opened, and this is obtained turning off the feedback signal, the PMOS transistor 520 is configured in a mirror mode with a high Rout and its gate voltage value Vgs is sampled on the capacitances of the capacitive SnH block 540 thus forcing a current value Iref+Ileakage to flow in the node A.

At this point the reference current generator Iref is turned off and the node A that has a voltage value corresponding to the gate-drain voltage of the PMOS transistor 520 configured as a diode allows the voltage value Q_V on node A to raise again since the transistor 520 is capable to supply a current greater than Ileakage.

The node A is an input of a differential amplifier 550 having the other input at a reference voltage Vref.

Once the node A is returned to a higher voltage value Q-V it is possible to start the reading phase of the memory cells by biasing the other line Y, i.e. the word line, that is selected with a downgrading voltage ramp that allows the selected cell to switch. So, a reduction in the voltage value on the word line allows the cell to switch once its threshold voltage has been reached.

The switched cells will start conducting a higher current that is substantially the sum of the leakage current plus the current of the switched cell. Therefore, if the selected cell switches the current Icell flowing throught cell is greater than Iref and the node A is discharged by closing the feedback line which turns the Line X to off.

Once the Iref is turned-off only the leakage current is supplied and the voltage value Q_V goes to rail because the mirror gate is kept for Ileakge+Iref.

The logic value stored in the cell is detected by the operational amplifier 550 that produces as output a voltage value indicating not only that the memory cell has been read but also representing an input voltage driven by a feedback line 580 connected to the node A and a to a discharge circuit portion 560.

The purpose of the discharge circuit portion is that of discharging the digit line X and to avoid disturbs on adjacent memory cells.

An output buffer 570 is provided as the output of the sense amplifier 500 to drive also the feedback line 580.

Figure 6A:
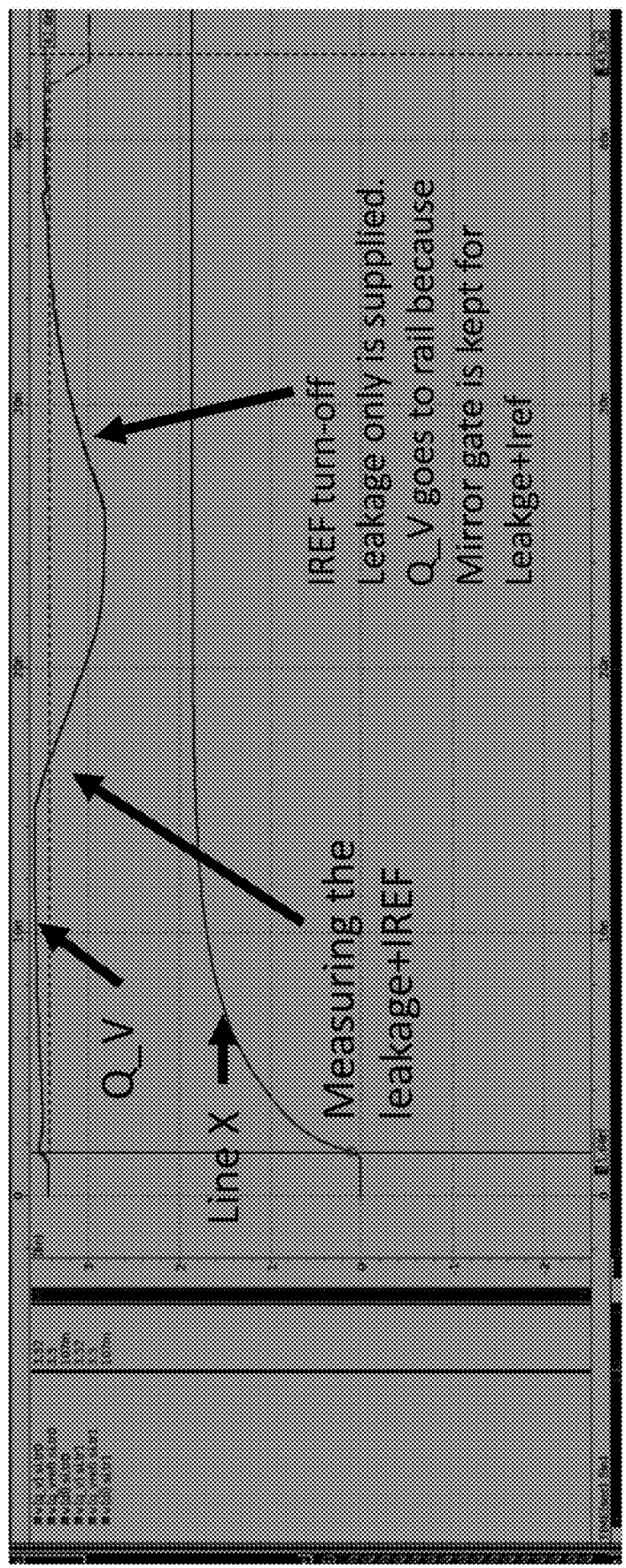
FIGS. 6A and 6B show schematic and comparative diagrams of voltage values evolution versus time on the node of the sense amplifier circuit of FIG. 5 and on the digit line during the precharge and the reading phases, respectively.

FIG. 6A shows on a schematic and comparative diagram the voltage values evolution versus time on the node A and on the digit line X during the precharge and the reading phases. The arrows and the corresponding labels reported in this diagram correspond to the functional disclosure of the sense amplifier structure 500 of the previous FIG. 5.

As it may be appreciated from this diagram, the measure of the current given by the sum of the Ileakage and the Iref is performed once the voltage value Q-V on the node A is starting to decrease while the voltage value on the digit line X is close to its maximum value.

On the contrary, when the current generator Iref is turned off, only the leakage current is supplied and the voltage value Q-V starts to raise to reach its previous value in the long run.

In other words, the precharge phase is performed for at least 20-30 ns, then the generator Iref is turned off and the node A returns to a high voltage value and the circuit generates a reference voltage Vref suitable for the operational amplifier 550 to detect a switched cell.

The voltage value Q-V on node A remains high up to the moment wherein the cell starts draining current and is reduced during the increasing of the current through the cell.

When the voltage value Q-V reaches the reference voltage value Vref, then the operational amplifier 550 switches detecting the logic value in the cell and, at the same time, activating the discharge circuit portion 560 that turns off the digit line X and avoid disturbs on the other adjacent memory cells.

To summarize, all the cells coupled to the digit line X that are not selected for the reading phase of the single selected cell are in any case biased by the pre-charge voltage (for instance: 2.5 V) even if the word lines are kept to 0 voltage. Therefore, all those non-selected cells will drain a small percentage of the whole current Ileakage that must be compensated with a margin given by the Iref current to avoid undesired switching of the non-selected cells that would produce a false reading.

The structure of the sense amplifier circuitry previously disclosed is used according to the present disclosure for implementing a pre-charge and reading algorithm having better performances in terms of reading accuracy.

First of all, it is worthwhile remarking that according to the present technology the delay time for an accurate reading of a 3D cross point memory cell takes about 100 ns since the write to read phase requires at least 85 nS to be completed.

A further delay is given by the so-called Reset Read Disturb that is generated during the reading phase of the cells programmed to the logic value "1" because the other cells programmed to the logic value "0" do not switch since their voltage is higher that the biasing voltage used for reading the cells having logic value "1" but they are anyhow disturbed.

The more the biasing voltage raises toward the reading limit of the cells having logic value "0", the more those cells (e.g., logic value "0") are subject to a disturb. Such a disturb produces by paradox a reduction in the switching voltage of the cells storing the logic value "0" thus further enhancing the disturb phase that generates tails in their voltage distribution possible limiting the read window.

These tails are not gaussian and a particular care should be taken during the reading phase even if window is intrinsically opened.

According to the present disclosure, a couple of possible timings procedures are presented to address both the above problems of Write to Read delay and Reset Read Disturb by fitting them into a specific common interface.

More particularly, the present disclosure relies on encoding and programming schemes that provide the storage, for each single codeword of memory cells, of distribution information enabling the proper setting of the reference voltage, and allowing an accurate subsequent reading of the user data regardless of the different electrical characteristics of memory cells, and thus regardless of possible different voltage distributions of the cells of different codewords. Such information may sometime be referred to as special information.

First of all, according to the present disclosure, a set of user data is stored in a plurality of memory cells of the memory array. The user data are generally encoded in a codeword having a number of bits exhibiting a first logic state, for instance "1", in a range. The encoding step comprises manipulating the codeword to constrain the number of bits exhibiting the first logic value in the range. In an embodiment, the encoded user data have substantially a same number of bits exhibiting the first logic state and the other second logic state "0".

In an embodiment of a programming method of the present disclosure, the cells are initially programmed to the first logic state "1" (i.e. a programming voltage is initially applied to switch the array cells to All1), even if the present disclosure is not limited thereto and another suitable configuration may be adopted.

The method of the present disclosure provides for a refresh of the memory codeword any time there is an access cycle to that codeword. This approach allows solving any problem in terms of Reset Read Disturb since possible variations in the voltage distribution of the stored logic values is rendered void by the refresh of those voltage values.

The Reset Read Disturb appears after many reading phases but if the content of logic values in the codeword is refreshed at any access time such a disturb cannot be generated.

It should be further noted that when a memory cell is programmed its threshold voltage is reduced and while the write to read delay is progressing the cell threshold raises again to return to the nominal value.

In view of this consideration, it is worthwhile programming first the logic value "0" because during the reading phase the cells having logic value "1" are forced to switch and it is more convenient that the cells having logic value "0" could keep their threshold pretty high not to interfere with the reading phase of the other cells. In other words, a reading phase with a lower biasing voltage can have a positive effect for reading the "1" logic values in a more accurate manner without any influence given by the other "0" logic values.

Therefore, the algorithm proposed by the present disclosure provides for a first programming phase of the "0" logic values and only after this phase the programming phase of the "1" logic values is performed. We will see this procedure in more details with reference to the diagram of FIG. 9.

It's important to note that during the write to read delay of the programming phase of the "1" logic values half of the time to wait for reading the "0" logic values is already expired.

When the read phase is newly performed in a subsequent codeword reading phase, the sense amplifier circuitry previously disclosed allows to perform a leakage compensation that represents at least another half of the write to read delay period.

Figure 6B:
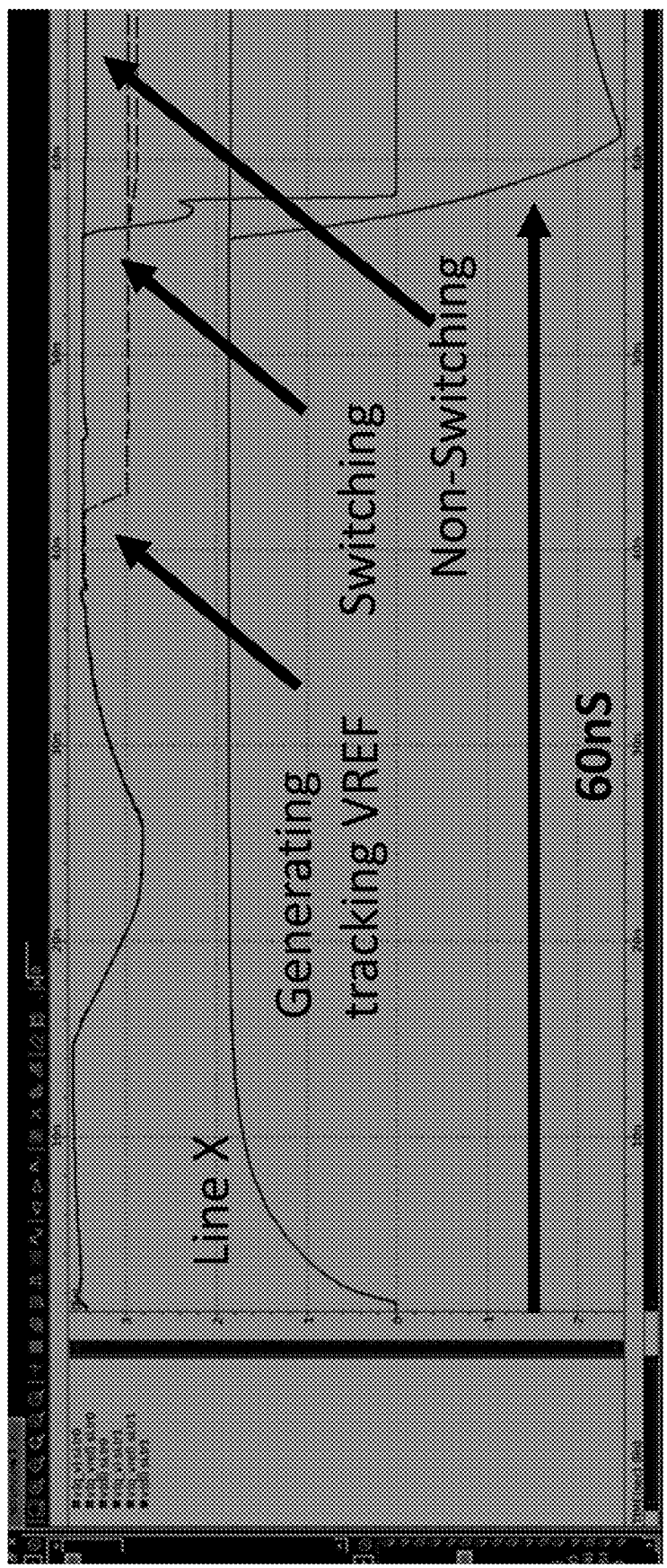

FIG. 6B shows on a schematic and comparative diagram the voltage values evolution versus time on the node A and on the digit line X during the precharge and the reading phases. The arrows and the corresponding labels reported in this diagram correspond to the functional disclosure of the sense amplifier structure 500 of the previous FIG. 5.

Figure 7A:
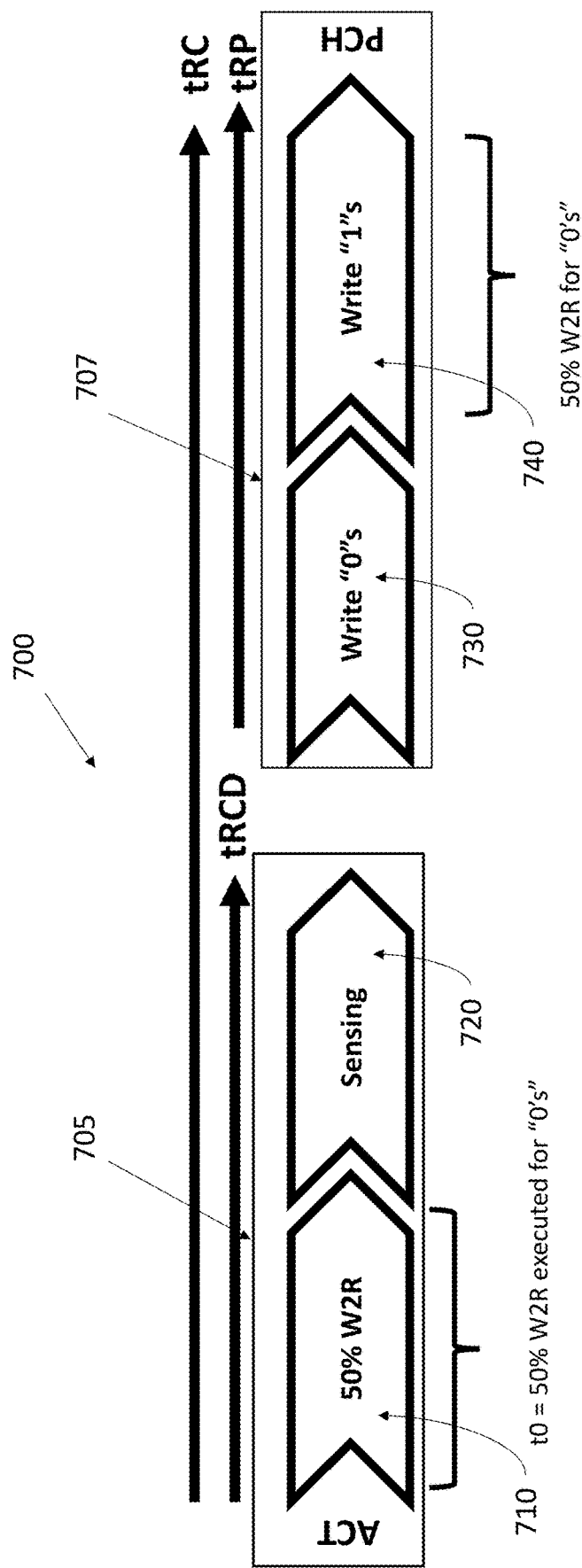
FIGS. 7A and 7B are block diagrams of two alternative embodiments of procedures for accessing and programming an array of memory cells according to the present disclosure.
Figure 7B:
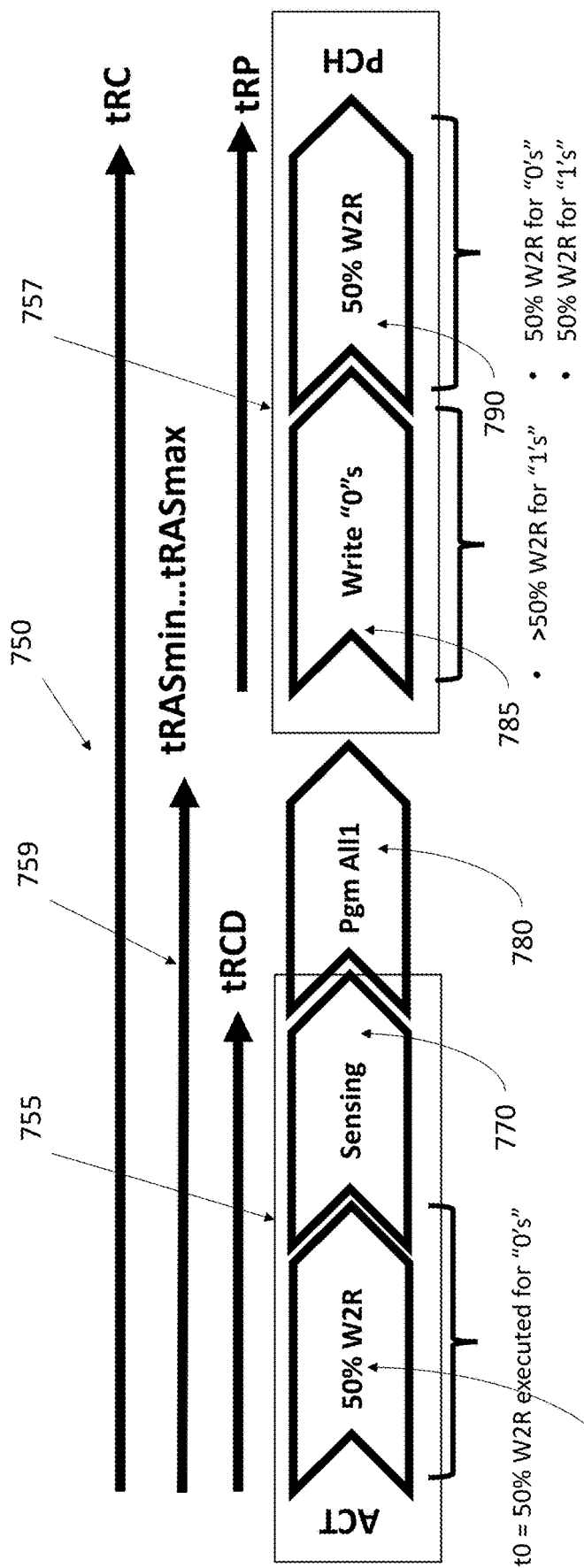

This situation is schematically represented in the block diagrams of the FIGS. 7A and 7B wherein it is indicated the whole time period tRC dedicated to the competition of the activate and pre-charge phase of a memory codeword. The tRC timing, also known as Row Cycle Time is the time interval passing from the consecutive activation of two memory rows of a same memory bank.

FIG. 7A relates to a first embodiment of a timing sequence 700 wherein the whole tRC timing is formed by the composition of a first activate portion 705 with a duration of a tRCD sub-period and a subsequent pre-charge portion 707 with a duration of a tRP sub-period. The first tRCD sub-period, also known as RAS to CAS Delay Time is the time interval passing from the activation of the row and column or digit line that identify the memory cell on which the data must be read or, in other words, the delay between the CAS signal (Column Access Strobe) with respect to the RAS signal (Row Access Signal).

The second sub-period tRP, also known as RAS Pre-charge Time, is the pre-charge phase of the Row Access Signal and is the delay from the moment wherein a row selection command is generated and a row selection subsequent command.

According to embodiments of the present disclosure, the write to read delay is mapped inside the whole tRC full cycle 700.

Just to give an indication of the time values under consideration, we may consider that the whole tRC timing is a period of about 170 nS according to the current technology, even if this value is purely indicative, and this time period comprises the two sub-periods tRCD and tRP dedicated to an activate phase and to a pre-charge phase respectively. Data is read and written from the interface incorporated into the memory controller and with the CAS accesses.

Again, just as an indicative value, the first activate phase sub-period may last 85 nS while the subsequent pre-charge phase sub-period may last other 85 nS. In the example of FIG. 7A drift and cycling are synchronized and the tRCD period corresponds to the tRASmin, so that a tRASmax is not needed.

As it may be appreciated by the diagram of FIG. 7A the first phase 710 of the activate portion 705 represents half (e.g., the 50% or approximatively 50%) of the write to read delay and is executed for the "0" logic values while the remaining phase 720 of the portion 705 is dedicated to the sensing phase.

As we have previously seen, the sensing circuitry 500 has capabilities of leakage compensation and this is performed during the sensing phase 720.

The lower threshold voltage Vth is dedicated to the "1" logic values for which the write to read delay of the recovering cells is addressed by a concurrent leakage analog compensation; for instance, it may be based on the last row address to current row address matching to enable=match or disable=mismatch.

The subsequent pre-charge portion 707 comprises a phase 730 dedicated to the write of the "0" logic values and another consecutive phase 740 dedicated to the write of the "1" logic values.

Even in this case half (e.g., 50% or approximatively 50%) of the write to read delay is dedicated to the "0" logic values. The sense time of the phase 720 as well as the write time of the phases 730 and 740 may have a duration of about 40 nS each.

If we consider that the write to read delay is a time period that passes anyhow from the moment wherein the writing of the "0" logic values is started and the reading of those values may be started, a delay that is needed for the preparation of the subsequent sensing phase, then we may appreciate that according to the present disclosure half of this period or delay is involved for solving the problem of the leakage compensation of the non-selected memory cells.

FIG. 7B illustrates an alternative embodiment wherein a timing sequence 750 wherein the whole tRC timing is formed by the composition of at least a first activate portion 755 with a duration corresponding to a tRCD sub-period and a subsequent pre-charge portion 757 with a duration given by a tRP sub-period. The first tRCD sub-period, also known as RAS to CAS Delay Time is the time interval passing from the activation of the row and column or digit line that identify the memory cell on which the data must be read or, in other words, the delay between the CAS signal (Column Access Strobe) with respect to the RAS signal (Row Access Signal).

The second sub-period tRP, also known as RAS Precharge Time, is the pre-charge phase of the Row Access Signal and is the delay from the moment wherein a row selection command is generated and a subsequent command.

Even in this alternative embodiment, and always according to embodiments of the present disclosure, the write to read delay is mapped inside the whole tRC full cycle 750.

However, differently from the previous embodiment of FIG. 7A, drift and cycling are not synchronized and the tRCD period does not correspond to the tRASmin because a further time period is dedicated to the programming phase of All1 logic values, as shown in phase 780. So, an extra time period 759 is dedicated to the RAS timing.

So, an indicative duration of the time period 759 may be variable in FIG. 7B between a tRASmin value of about 120 nS and a tRASmax value of about 2 μS.

Just to give an indication of the time values under consideration, we may consider that the whole tRC timing of this second embodiment is a period of about 200 nS according to the current technology, even if this value is purely indicative, and this time period comprises at least the two sub-periods tRCD and tRP dedicated to an activate phase and to a pre-charge phase respectively plus the RAS period 759. Data is always read and written from the interface incorporated into the memory controller and with the CAS accesses.

However, as in the previous example of FIG. 7A, the first phase 760 of the activate portion sub-period may last 85 nS while the first phase 785 of the subsequent pre-charge portion sub-period may last other 85 nS.

As it may be appreciated by the diagram of FIG. 7B the first phase 760 of the activate portion 755 represents half (e.g., 50% or approximatively 50%) of the write to read delay and is executed for the "0" logic values while the remaining timing 770 is dedicated to the sensing phase. The extra timing 759 is for the programming phase of ALL1 logic values.

As we have previously seen, the sensing circuitry 500 has capabilities of leakage compensation and this is performed during the sensing phase 770.

The subsequent pre-charge portion 757 comprises a phase 785 dedicated to the write of the "0" logic values and another consecutive phase 790 dedicated to the write of the "1" logic values.

Even in this case half (e.g., 50% or approximatively 50%) of the write to read delay is dedicated to the "0" logic values. The sense time of the portion 770 as well as the write time of the portions 785 and 790 may have a duration of about 40 nS each.

If we consider that the write to read delay is a time period that passes anyhow from the moment wherein the writing of the "0" logic values is started and the reading of those values may be started, a delay that is needed for the preparation of the subsequent sensing phase, then we may appreciate that according to the present disclosure half of this period or delay is involved for solving the problem of the leakage compensation of the non-selected memory cells.

Figure 8:
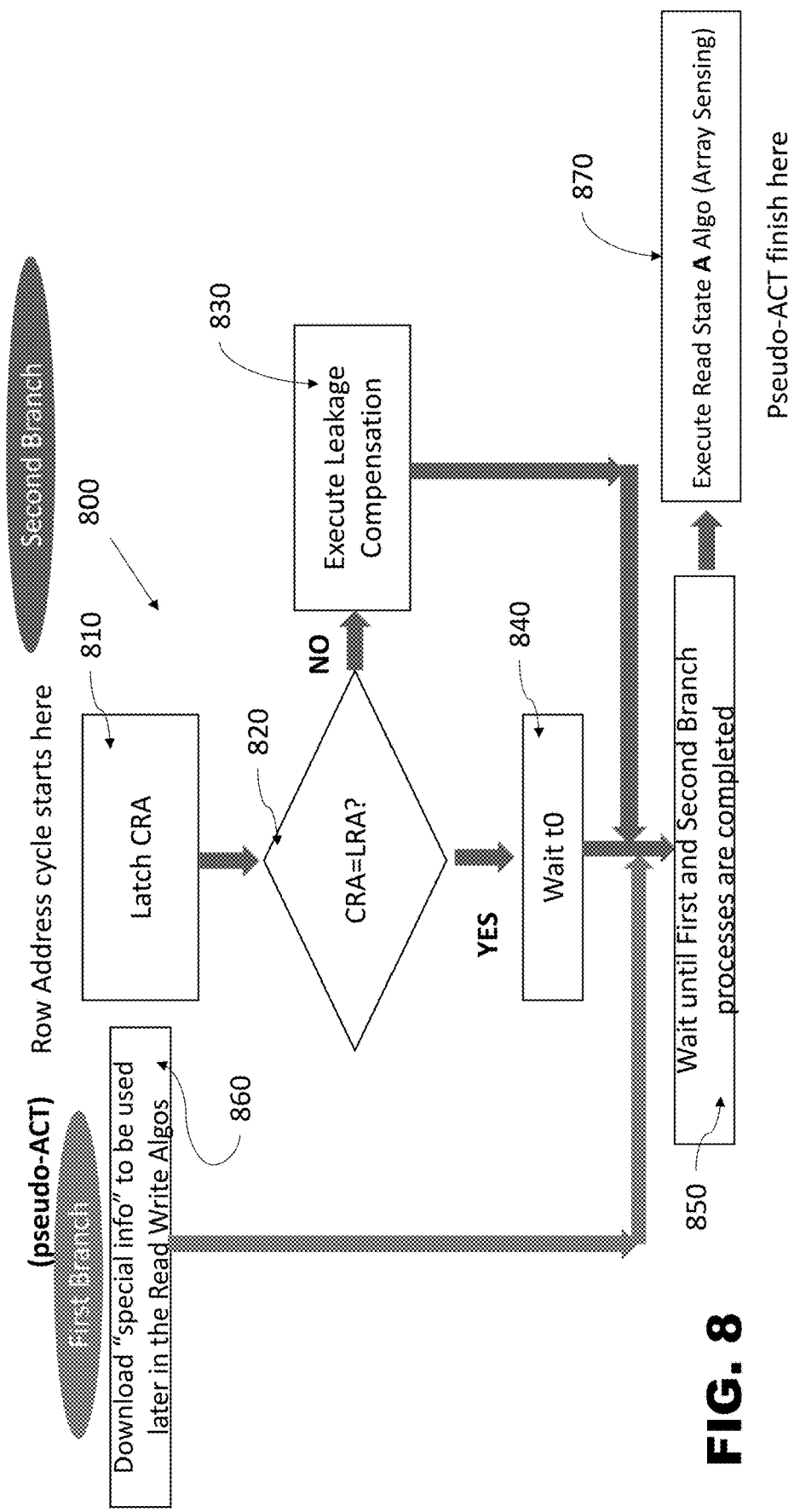
FIG. 8 is a flow diagram representing steps of a method for accessing an array of memory cells according to the present disclosure.

FIG. 8 shows a schematic view of a flow chart explaining the main operative blocks of the memory access algorithm of the present disclosure that may be identified by a first and a second branch. The first branch procedure will be disclosed later. FIG. 8 describes a pseudo-activate (pseudo-ACT) command step. The two branches may be concurrent (e.g., they may be carried out in parallel).

The processes described can be performed by hardware logic and circuitry incorporated into the memory controller. For example, the following processes are described as being performed by access circuitry and sense circuitry, as disclosed herein. However, other embodiments can include different circuitry configurations suitable for performing the processes.

The first step of the second branch procedure is represented by the block 810 wherein the Current Row Address CRA is latched and stored in a memory potion, for instance a register. The Current Row Address is provided by the user and represents a memory location that the user would like to access.

In a subsequent test block 820 the Current Row Address is compared with the Last Row Address LRA of a previous access; this Last Row Address was previously stored in a memory portion, for instance another register. Therefore, both LRA and CRA are stored into bank-logic registers addresses and matched.

If the result of the comparison is positive, this means that the current address is the same of the previously accessed address; in such a case the algorithm waits for the completion of the write to read delay that may be considered completed at the time t0, as schematically shown in block 840.

As previously remarked with reference to the example of FIG. 6, the time t0 is trimmable and could be for instance half (e.g., 50% or approximatively 50%) of the write to read delay, for example 50 nS.

On the contrary, if the result of the comparison is negative, and this happens in the majority of the cases, the sensing circuitry of the present disclosure will perform a leakage compensation as disclosed in previous paragraphs and represented by the block 830.

This situation is neutral in terms of delay in the sense that the write to read delay is already passed with respect to the programming phase of the current address. In other words, from the start of the programming phase of the current address and the reading phase of such an address it is already passed the reading and programming phase of another address, i.e. the last elaborated address.

Therefore, the leakage compensation phase 830 may be started immediately after the negative result of the testing phase of the block 820.

At the end of the leakage compensation phase 830, or after the time t0, the pre-charge period has been substantially completed.

This situation is represented by the last block 850 (Wait until First and Second Branch processes are completed) that is also the arrival point of the first branch procedure shown on the left side of the FIG. 8.

The left block 860 shows schematically the possible first branch procedure that may be performed in parallel with the activities already disclosed with reference to the blocks 810-850 of the second branch procedure. This parallel procedure (e.g., block 860) is the download of special information to be used later in the read and write algorithms.

For a better understanding of this first branch procedure it should be remarked that when programming an array of 3D memory cells, a predetermined number of memory cells of the array, that may be referred to as "trigger memory cells T", is used to detect the switching of another predetermined number of cells having a given logic state, for instance the logic state of "1".

More particularly, a first programming voltage for programming cells to a first logic state is applied to the memory cells of the array. When it is determined that a predetermined first group of memory cells, i.e. the above mentioned trigger memory cells T, has been switched to an active state based on the application of the first programming voltage, this programming voltage corresponding to the activation of all said cells (herein referred to as "first threshold voltage") is stored into a portion of the memory array. The first threshold voltage is thus the programming voltage used to activate the preset number of trigger memory cells T in the first logic state, e.g. in the logic state "1".

In other words, the number T of cells acting as trigger and the value of the first threshold voltage are information that may be useful for the subsequent writing phase.

In an embodiment, the trigger memory cells T are used to store the intrinsic switching value of the voltage distribution of a set of memory cells programmed to the first logic state. According to other embodiments, any point of the cell voltage distribution may be identified and tracked as a reference point.

Moreover, the expected extreme (e.g. maximum) threshold voltage value of the voltage distribution of the memory cells is precisely calculated each time a codeword is programmed into said cells, as each codeword may have its specific distribution. In view of that, and according to embodiments of the present disclosure, it is provided the storage, for each codeword of the memory array, of additional data information, sometimes referred to as special information, as specified in block 860.

Those additional data information may be for instance: a voltage difference $\Delta N$ between the first threshold voltage (i.e. the voltage to activate the preset number of trigger memory cells T programmed to the first logic state) and a second threshold voltage used to program the remaining cells of the array, or the number of cells in the codeword having a given logic value, or information about the threshold voltage distribution, which may be different from codeword to codeword.

In this respect, any of the algorithms that may be adopted for recovering the additional special information associated to a codeword could be implemented in this first branch procedure.

At the end of the two parallel procedures represented by the first and second branches of the algorithm reported in FIG. 6 the controller of the memory device is ready to proceed to block 870 for the reading phase of the first or "A" status, that is to say checking though the sensing circuitry 500 of the present disclosure if the memory cells have been switched or not.

We may consider as indicative that the status "A" is represented by the logic values "1".

The operation performed in block 870 may take advantage of the special information picked up during the phase 860; for instance, the information about the number of bits in the state "A".

The pseudo-activate (pseudo-ACT) command step disclosed with reference to FIG. 8 may be considered completed in block 870 and the physical interface of the memory controller may be structured as a DRAM access interface provided with a Column Access Strobe (CAS) latency. The CAS latency is the delay between the time at which the column address and the column address strobe signal are presented to the memory module and the time at which the corresponding data is made available by the memory module. The desired row must already be active; if it is not, additional time is required.

Figure 9:
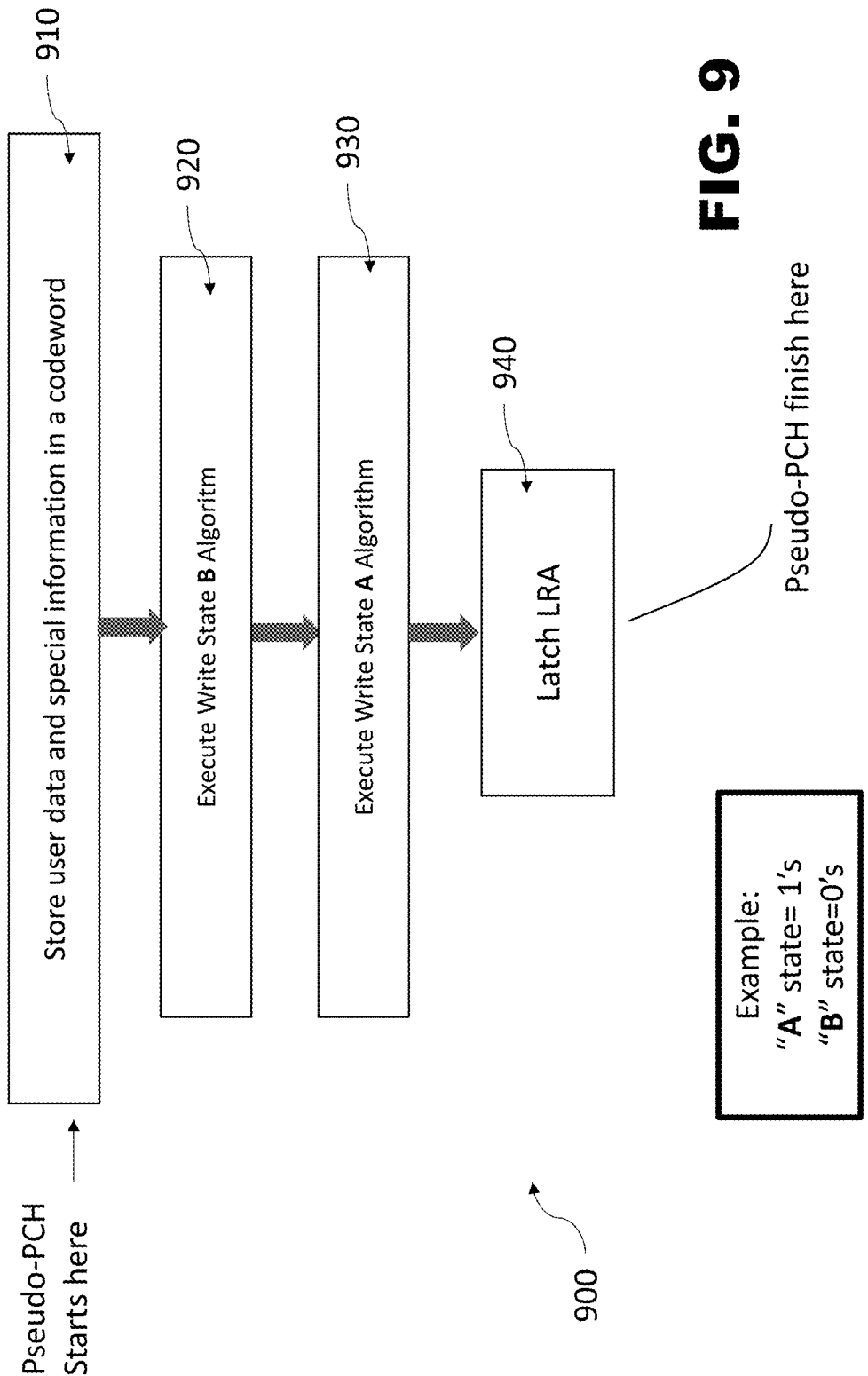
FIG. 9 is a flow diagram representing respective steps of a method for programming an array of memory cells according to the present disclosure.

FIG. 9 shows a schematic view of a flow chart explaining the main operative blocks of the memory programming and writing algorithm 900 of the present disclosure. FIG. 9 describes a pseudo-precharge (pseudo-PCH) command step.

The method of the present disclosure is a method for improving access operations of memory cells. Prior to reading the memory cells, access circuitry writes data to a plurality of memory cells. For example, access circuitry writes logic 0s and logic 1s to a plurality of memory cells such as the memory cell 100' of FIG. 1. In one embodiment, access circuitry can write logic 0s by applying programming pulses with a first polarity and logic 1's by applying programming pulses with a second polarity different from the first polarity. In another embodiment, access circuitry can write logic 0s by applying programming pulses with a first amplitude, duration and shape and logic 1s by applying programming pulses with a second amplitude, duration and shape at least one of which may be different from the first amplitude, duration and shape. The resulting programmed logic "1" state may have a lower threshold voltage and a programmed logic "0" state may have a higher threshold voltage.

In block 910, user data and special information are stored in a codeword. User data and/or special information may be encoded so as to have a balanced or quasi-balanced number of bits in a first state "A" (e.g., a logic "1" value) and a second state "B" (e.g., a logic "0" value). The additional special information may concern, for instance: a counter with the number of cells in the codeword having a given logic value, i.e. the number of bits in the state "A" and/or the number of bits in the state "B", the average or peak value of lower and/or higher threshold voltages, the width of the voltage distribution(s), which may be different from codeword to codeword, parity bits, etc.

Those additional data information are stored in a portion of the memory array, the additional data information could also be a voltage difference between a first threshold voltage and a second threshold voltage of the memory cells of the set of user data programmed to a first logic state, wherein the first threshold voltage is a voltage to activate a preset number of memory cells programmed to the first logic state, and wherein the second threshold voltage is a voltage to activate memory cells programmed to the first logic state having a threshold voltage whose magnitude is higher than the first threshold voltage and is based on the statistical distribution of the threshold voltages of the memory cells of said set of user data.

In block 920, write state B algorithm is executed. In other words, all operations are performed to write or program the memory cells of the codeword that must store the "B" status (the logic state "0", for example). This step may be referred to as array programming. The write state B algorithm is included in the pseudo-precharge command step.

In subsequent step 930, write state A algorithm is executed. In other words, all operations are performed to write or program the memory cells that must store the "A" status (the logic state "1", for example). This step may be referred to as complement array programming. The write state A algorithm is included in the pseudo-precharge command step. Both writing algorithms (e.g., for state A and for state B) are included in the pseudo-precharge command step In block 940, the Last Row Address (LRA) register is latched. The last address of the memory array that has been accessed (i.e. read and programmed) is contained in the LRA (and/or LCA—Last Column Addressed). It is updated and its value corresponds to the current row address CRA, so that the LRA register is always updated with the last reading phase. The pseudo-precharge (pseudo-PCH) command step disclosed with reference to FIG. 9 may be considered completed in block 940.

The techniques disclosed herein have several advantages, since the write to read delay is mapped into the time period tRC.

Moreover, the Reset Read Disturb is eliminated since every cycle is writing back the data on the accessed codeword.

It should be further noted that standard interface will make easier the early adoption of 3D or emerging memories without requiring disruptive changes to memory controller.

Figure 10:
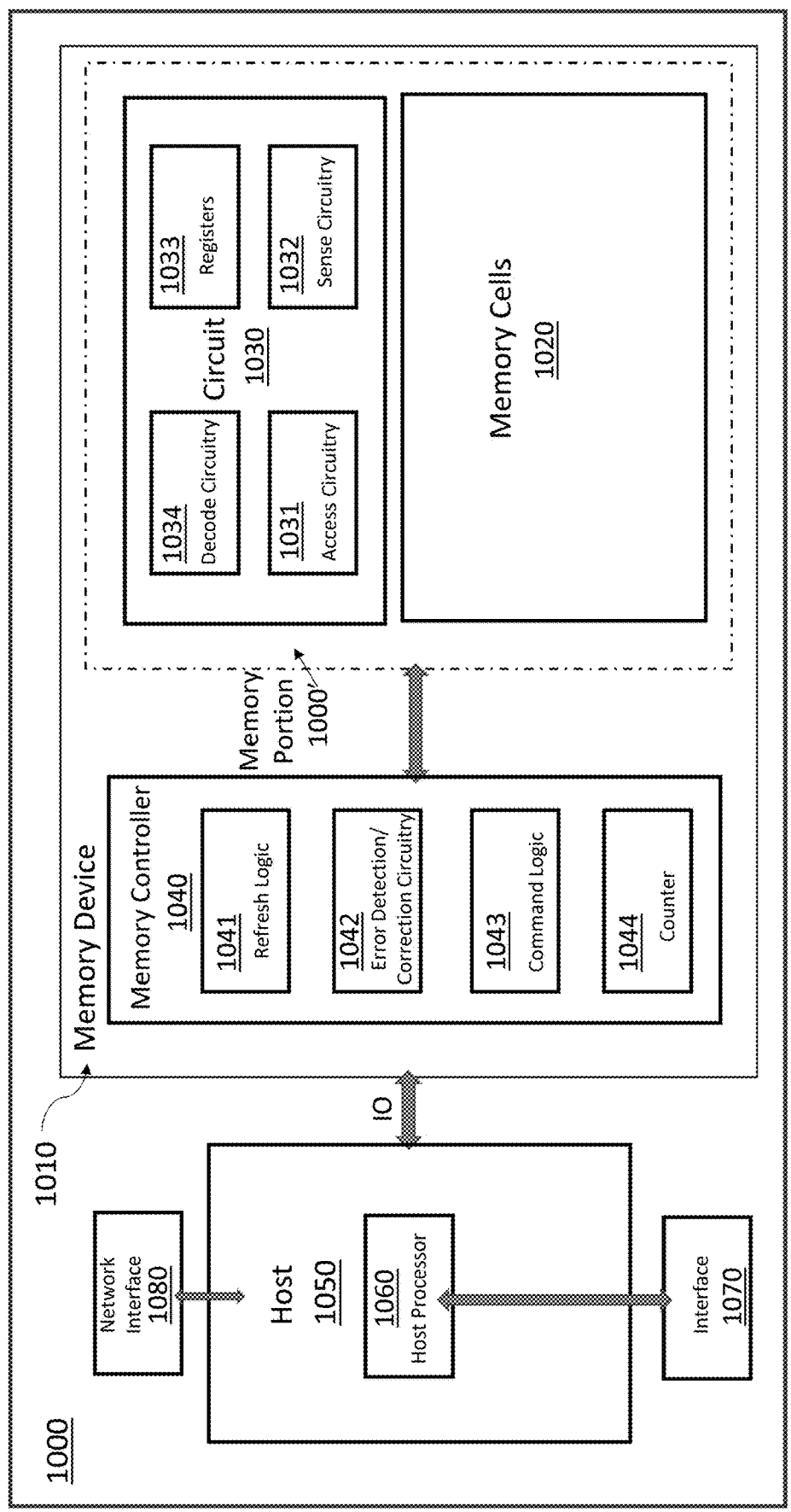
FIG. 10 shows a schematic block diagram of a system including a memory device according to the disclosure.

FIG. 10 is a high-level scheme of a system 1000 that can perform the read algorithm of the present disclosure. The system 1000 includes a memory device 1010 in turn including an array of memory cells 1020 and a circuit 1030 operatively coupled to the memory cells 1020; the memory cells 1020 and the circuit 1030 form a memory portion, herein referred to as memory portion 1000'.

The memory device 1010 comprises a memory controller 1040, which represents control logic that generates memory access commands, for example in response to command by a host 1050. Memory controller 1040 accesses memory portion 1000'. In one embodiment, memory controller 1040 can also be implemented in the host 1050, in particular as part of a host processor 1060, even if the present disclosure is not limited by a particular architecture. The controller 1040 can include an embedded firmware and is adapted to manage and control the operation of the memory portion 1000'.

In general, the memory controller 1040 may receive user data through input/output IO. As shown before, in some embodiments, the memory controller encodes the user data to satisfy a condition prior to storing the user data in memory cells. The condition may be satisfied when encoded user data have a predetermined number of bits exhibiting a given logic value (e.g., a logic value of 1). As a way of example, the encoded user data may be configured to have 50% of the memory cells storing the encoded user data to exhibit the logic state of 1 while the other 50% of the memory cells to exhibit a logic state of 0 (i.e. the balanced encoding scheme, where half of the encoded user data bits have a logic state of 1, and the other half have a logic state of 0). During the encoding process, the memory controller 1040 may add a certain number of bits (e.g., parity bits) to the user data to establish the predetermined number of memory cells to exhibit the given logic state. As a result of adding the parity bits, the encoded user data may have more bits than the user data. In some embodiments, a different percentage value (e.g., 40%, 60%, 75%) of the memory cells exhibiting the logic state of 1 may be employed during the encoding process.

The value of the voltage difference $\Delta N$ may be stored by the memory controller 1040 in the array as a codeword portion.

The memory device 1010 can also comprise other components, such as processor units coupled to the controller 1040, antennas, connection means (not shown) with the host device, and the like.

Multiple signal lines couple the memory controller 1040 with the memory portion 1000'. For example, such signal lines may include clock, command/address and write data (DQ), read DQ, and zero or more other signal lines. The memory controller 1040 is thus operatively coupled to the memory portion 1000' via suitable buses.

The memory portion 1000' represents the memory resource for the system 1000. In one embodiment, the array of memory cells 1020 is managed as rows of data, accessed via wordline (rows) and bitline (individual bits within a row) control. In one embodiment, the array 1020 of memory cells includes a 3D crosspoint array such as the memory cell array 200 of FIG. 2. The array 1020 of memory cells can be organized as separate channels, ranks, and banks of memory.

Channels are independent control paths to storage locations within memory portion. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, the memory controller 1040 includes refresh (REF) logic 1041. In one embodiment, refresh logic 1041 indicates a location for refresh, and a type of refresh to perform. Refresh logic 1041 can trigger self-refresh within memory, and issue external refreshes by sending refresh commands to trigger the execution of a refresh operation.

In one embodiment, access circuitry 1031 of the circuit 1030 performs a refresh (e.g., reprogramming) of any of the accessed memory cells that were not refreshed during the read sequence. Therefore, a complete refresh of memory cells can be achieved as mostly a side effect of the memory read sequence with minimal additional refresh operations.

In an embodiment, the circuit can also be embedded in the memory controller, even if the present disclosure is not limited by a particular architecture.

In the exemplary embodiment illustrated in FIG. 10, the memory controller 1040 includes error correction circuitry 1042. The error detection/correction circuitry 1042 can include hardware logic to implement an error correction code (ECC) to detect errors occurring in data read from memory portion. In one embodiment, error detection/correction circuitry 1042 also corrects errors (up to a certain error rate based on the implemented ECC code). However, in other embodiments, error detection/correction circuitry 1042 only detects but does not correct errors.

More in particular, the controller 1040 may be configured to encode user data according to an Error Correction Code (ECC) scheme, and may comprise a syndrome calculation unit configured to produce, from the encoded set of user data, a syndrome value, the controller being configured so that, when the syndrome value is zero, the corresponding programming voltage value is stored in a register and/or latch of the array and, when the syndrome is different from zero, the corresponding programming voltage is ignored, wherein the second threshold voltage is the last programming voltage corresponding to a syndrome equal to zero, the controller being configured to update in said register or latch the programming voltage anytime the ECC syndrome is toggling from a value different from zero to zero, according to an architecture analogous to the one shown in FIG. 7.

In an embodiment, the first threshold voltage is the median threshold voltage value of the memory cells in the first logic state, the controller being configured to track said median value.

In the illustrated embodiment, the memory controller 1040 includes command (CMD) logic 1043, which represents logic or circuitry to generate commands to send to memory portion. The memory controller 1040 may also include a counter 1044, such as the per-codeword counter disclosed above and configured to count the number of bits switched during the read operation. Clearly, also other architectures can be employed, for example the counter can be embedded in the host 1050 or also in the circuit 1030.

Based on the received command and address information, access circuitry 1031 of the circuit 1030 performs operations to execute the commands, such as the read operation of the present disclosure. In one such embodiment, the circuit 1030 includes sense circuitry 1032 to detect electrical responses of the one or more memory cells to the applied read voltage. In one embodiment, the sense circuitry 1032 include sense amplifiers. FIG. 10 illustrates the access circuitry 1031 and sense circuitry 1032 as being embedded in the memory portion 1000', however, other embodiments can include access circuitry and/or sense circuitry that is separate from the memory portion 1000'. For example, access circuitry and sense circuitry can be included in a memory controller such as the memory controller 1040.

Sense circuitry may be configured to detect a current through a given memory cell in response to the read voltage, wherein the access circuitry is configured to determine that the given memory cell is in the first logic state based on detection that a magnitude of the current is greater than or equal to a threshold current.

In one embodiment, memory portion 1000' includes one or more registers 1033. The registers 1033 represent one or more storage devices or storage locations that provide configuration or settings for the operation of the memory portion. Furthermore, in one embodiment, the circuit 1030 includes also decode circuitry 1034.

The host device 1050 is a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The memory device 1010 may also be embedded in the host device 1050.

In one embodiment, the system 1000 includes an interface 1070 coupled to the processor 1060, which can represent a higher speed interface or a high throughput interface for system components that needs higher bandwidth connections, and/or graphics interface components. Graphics interface interfaces to graphics components for providing a visual display to a user of system 1000. In one embodiment, graphics interface generates a display based on data stored in the memory device or based on operations executed by processor or both.

The system may also comprise network interface 1080 communicatively coupled to the host or to memory device for example for connecting with other systems, and/or a battery coupled to provide power to said system.

In conclusion, the present disclosure provides a read and programming method based on the switching of a predetermined and the subsequent application of a read pulse determined, codeword by codeword, according to the actual statistical distribution of bits in the codeword, improving the performances of the array.

According to an exemplary embodiment, a method for accessing an array of memory cells wherein a set of user data is stored in a plurality of memory cells of the memory array, comprising at least the steps of:

latching a current row address of a selected plurality of memory access;

comparing a last row address with the current row address;

if the result of the comparison is negative, executing a leakage compensation algorithm through a memory sensing circuitry;

if the result of the comparison is positive, waiting for the completion of a write to read procedure on the selected plurality of memory cells.

According to another exemplary embodiment, a method for programming an array of memory cells wherein a codeword of user data are stored in the memory array, comprising at least the steps of:
executing first a writing algorithm for "0" logic values of the codeword;
executing a subsequent writing algorithm for "1" logic values of the codeword;
latching a last row access address.

The present disclosure also discloses a memory device comprising
an array of memory cells;
at least a codeword in the memory array including a set of user data and additional data information,
a memory controller configured to execute instructions for accessing the memory cells; and
a circuit for accessing the memory cells, the circuit being operatively coupled with the array of memory cells and comprising at least:
an access circuit configured to apply to the memory array a read voltage to activate at least said codeword of memory cells; and
a sense circuit configured to support precharging and reading operations on said codeword;
wherein, said sense circuit is structured with a leakage compensation circuit portion to avoid false reading of the cells of the codeword.

A related system, comprising a host device and a memory device as above is also disclosed.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method comprising:
accessing an array of memory cells wherein a set of user data is stored in a plurality of memory cells of the memory array;
latching a current row address of a selected plurality of memory access;
comparing a last row address with the current row address;
if the result of the comparison is negative, executing a leakage compensation algorithm through a memory sensing circuitry.

2. The method of claim 1 further including:
refreshing the user data at any access of such a plurality of memory cells.

3. The method of claim 1 wherein said latching, comparing and executing the leakage compensation algorithm are completed in a time interval having a duration of half of time period tRC passing from the consecutive activation of two memory rows of a same memory bank and corresponding to an activate portion.

4. The method of claim 3 wherein the whole time period tRC includes a sub-period tRP of a pre-charge portion of the Row Access Signal (RAS) and in this sub-period a writing phase is performed.

5. The method of claim 3 wherein a first phase of the activate portion represents half of a write to read delay and is executed for "0" logic values while a remaining phase of the activate portion is dedicated to a sensing phase.

6. The method of claim 3 wherein the write to read delay is mapped inside a whole time period tRC full cycle.

7. The method of claim 1 wherein said plurality of memory cells is part of a codeword and special information are stored in association with the codeword; said further information concerning at least one of statistical distributions of the bits programmed in the memory cells, or a number of bits of the codeword, or applied threshold voltages values, and being downloaded in parallel during said latching, comparing and executing the leakage compensation algorithm.

8. The method of claim 1 comprising a first pseudo-activate command and a subsequent pseudo-precharge command related to a codeword of the memory array; said latching, comparing and executing the leakage compensation algorithm being performed during the pseudo-activate command.

9. The method of claim 8 further including read and/or write commands corresponding to standard DRAM commands.

10. The method of claim 9 wherein the write commands are executed during said pseudo-precharge command.

11. The method according to claim 1, wherein the user data are encoded in a codeword having a number of bits exhibiting a first logic state in a range, the encoding comprising manipulating the codeword to constrain the number of bits exhibiting the first logic value in the range.

12. The method according to claim 11, wherein the encoded user data have substantially a same number of bits exhibiting the first logic state and a second logic state, and wherein the memory cells exhibit a threshold voltage with a lower magnitude when the memory cells are in the first logic state, and a threshold voltage with a higher magnitude when the memory cells are in the second logic state, and wherein a logic state of a given cell is determined based on whether the memory cell exhibits the higher or the lower magnitude threshold voltage in response to an applied read voltage.

13. A memory device comprising:
an array of memory cells;
at least a codeword in the memory array including a set of user data and additional data information;
a memory controller configured to execute instructions for accessing the memory cells;
a circuit for accessing the memory cells, the circuit being operatively coupled with the array of memory cells and comprising:
an access circuit configured to apply to the memory array a read voltage to activate at least said codeword of memory cells; and
a measuring circuit portion in a sense circuit for measuring a leakage current value at an end of a precharge operation;
wherein the sense circuit is further configured to detect a leakage current flowing through non-selected memory cells coupled to a same digit line and to determine a feedback voltage value to be applied to a circuit node for compensating such a leakage current.

14. The memory device of claim 13 wherein the array of memory cells comprises a Self-Selecting Memory (SSM) or a 3D cross point (3D X Point) memory.

15. The memory device of claim 13, further comprising leakage compensation circuit portion of the sense circuit is configured to be activated during a time interval having a duration of half of a time period tRC passing from consecutive activation of two memory rows of a same memory bank and corresponding to an activate portion of the memory access algorithm.

16. A system having a memory device according to claim 13, further comprising:
a host device.

* * * * *